(12) United States Patent
Shen et al.

(10) Patent No.: US 11,935,938 B2
(45) Date of Patent: Mar. 19, 2024

(54) DEVICES AND METHODS FOR CREATING OHMIC CONTACTS USING BISMUTH

(71) Applicant: Massachusetts Institute of Technology, Cambridge, MA (US)

(72) Inventors: Pin-Chun Shen, Changhua (TW); Jing Kong, Winchester, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 46 days.

(21) Appl. No.: 17/320,183

(22) Filed: May 13, 2021

(65) Prior Publication Data

US 2021/0359099 A1 Nov. 18, 2021

Related U.S. Application Data

(60) Provisional application No. 63/024,141, filed on May 13, 2020.

(51) Int. Cl.
*H01L 29/49* (2006.01)
*H01L 29/45* (2006.01)
*H01L 29/66* (2006.01)

(52) U.S. Cl.
CPC ......... *H01L 29/4983* (2013.01); *H01L 29/45* (2013.01); *H01L 29/66628* (2013.01)

(58) Field of Classification Search
CPC ........... H01L 29/45–458; H01L 29/775; H01L 29/78681; H01L 2924/01083
See application file for complete search history.

(56) References Cited

U.S. PATENT DOCUMENTS

| | | | | |
|---|---|---|---|---|
| 2006/0246304 A1* | 11/2006 | Ishihara | ................... | H01L 23/24 257/E23.04 |
| 2010/0258787 A1* | 10/2010 | Chae | ................. | H01L 29/78684 257/39 |
| 2012/0168722 A1* | 7/2012 | Chung | .............. | H01L 29/66045 977/734 |
| 2015/0155374 A1* | 6/2015 | Byun | ..................... | H01L 29/456 257/192 |
| 2019/0131410 A1* | 5/2019 | Li | .......................... | H10K 10/00 |
| 2019/0378715 A1* | 12/2019 | Lin | ................... | H01L 21/02485 |

(Continued)

OTHER PUBLICATIONS

"Single-Crystal Antimonene Films Prepared by Molecular Beam Epitaxy: Selective Growth and Contact Resistance Reduction of the 2D Material Heterostructure" in CS Appl. Mater. Interfaces 2018, 10, 17, 15058-15064, by Chen et al (Year: 2018).*

(Continued)

*Primary Examiner* — Eric A. Ward
(74) *Attorney, Agent, or Firm* — Barnes & Thornburg LLP

(57) ABSTRACT

Devices, such as transistors, that use bismuth to create ohmic contacts are provided, as are methods of manufacturing the same. The transistors, such as field-effect transistors, can include one or more two-dimensional materials, and electrical contact areas can be created on the two-dimensional material(s) using bismuth. The bismuth can help to provide energy-barrier free, ohmic contacts, and the resulting devices can have performance levels that rival or exceed state-of-the-art devices that utilize three-dimensional materials, like silicon. The two-dimensional materials can include transition metal dichalcogenides, such as molybdenum disulfide.

8 Claims, 18 Drawing Sheets

(56) References Cited

U.S. PATENT DOCUMENTS

| | | | | |
|---|---|---|---|---|
| 2020/0006541 A1* | 1/2020 | Lin | ................... | H01L 29/66969 |
| 2020/0303417 A1* | 9/2020 | Teo | ..................... | G06F 12/0238 |
| 2021/0057524 A1* | 2/2021 | Lin | ........................ | H01L 29/24 |

OTHER PUBLICATIONS

"Effect of edge roughness on electronic transport in graphene nanoribbon channel metal-oxide-semiconductor field-effect transistors" in Appl. Phys. Lett. 92, 042114 to Basu et al. (Year: 2008).*
Akinwande, et al. "Graphene and two-dimensional materials for silicon technology". Nature. 573, pp. 507-518. 2019.
Allain, et al., "Electrical contacts to two-dimensional semiconductors." Nature Materials. 14, pp. 1195-1205. 2015.
Badaroglu, et al. "More Moore landscape for system readiness—ITRS2.0 requirements". 2014 IEEE 32nd International Conference on Computer Design (ICCD). 2014.
Cao, et al. "Low Schottky barrier contacts to 2H—MoS2 by Sn electrodes". Applied Physics Letters. 116, p. 022101. 2020.
Chakraborty, et al., "Symmetry-dependent phonon renormalization in monolayer MoS2transistor." Physical Review B. 85. 2012.
Chee, et al. "Lowering the Schottky Barrier Height by Graphene/ Ag Electrodes for High-Mobility MoS Field-Effect Transistors". Adv. Mater. 31, el804422. 2019.
Chhowalla, et al. "Two-dimensional semiconductors for transistors". Nature Reviews Materials. 1. 2016.
Cui, et al., Low-Temperature Ohmic Contact to Monolayer MoS2 by van der Waals Bonded Co/h-BN Electrodes. Nano Letters. 17, pp. 4781-4786. 2017.
Das, et al., "High performance multilayer MoS2 transistors with scandium contacts." Nano Lett. 13, pp. 100-105. 2013.
Desai, et al., "MoS2 transistors with I-nanometer gate lengths." Science. 354, pp. 99-102. 2016.
English, et al., "Approaching ballistic transport in monolayer MoS2 transistors with self-aligned 10 nm top gates." 2016 IEEE International Electron Devices Meeting. 2016.
English, et al., "Improved Contacts to MoS2 Transistors by Ultra-High Vacuum Metal Deposition." Nano Lett. 16, 3824-3830. 2016.
Fiori, et al., "Velocity saturation in few-layer MoS2 transistor." Applied Physics Letters. 103, p. 233509. 2013.
Franklin, "Nanomaterials in transistors: From high-performance to thin-film applications." Science. 349, p. aab2750. 2015.
Gao, et al., "Transition-Metal Substitution Doping in Synthetic Atomically Thin Semiconductors." Adv. Mater. 28, 9735-9743. 2016.
Ghani, et al. "A 90nm high volume manufacturing logic technology featuring novel 45nm gate length strained silicon CMOS transistors". IEEE International Electron Devices Meeting. 2003.
Guimaraes, et al., "Atomically Thin Ohmic Edge Contacts Between Two-Dimensional Materials." ACS Nano. 10, pp. 6392-6399. 2016.
Jung, et al., "Transferred via contacts as a platform for ideal two-dimensional transistors." Nature Electronics. 2, pp. 187-194. 2019.
Kang, et al., "Computational Study of Metal Contacts to Monolayer Transition-Metal Dichalcogenide Semiconductors." Physical Review X 4. 2014.
Kappera, et al., "Phase-engineered low-resistance contacts for ultrathin MoS2 transistors." Nat. Mater. 13, pp. 1128-1134. 2014.
Kim, et al., "Fermi Level Pinning at Electrical Metal Contacts of Monolayer Molybdenum Dichalcogenides." ACSNano.11, pp. 1588-1596. 2017.
Kim, et al., "High-mobility and low-power thin-film transistors based on multilayer MoS2 crystals." Nat. Commun. 3, p. 1011. 2012.
Kobayashi, et al. "Fermi level depinning in metal/Ge Schottky junction for metal source/drain Ge metal-oxide-semiconductor field-effect-transistor application". Journal of Applied Physics. 105, p. 023702. 2009.

Kwon, et al. "Thickness-dependent Schottky barrier height ofMoS field-effect transistors". Nanoscale. 9, pp. 6151-6157. 2017.
Li, et al., "Thickness scaling effect on interfacial barrier and electrical contact to two-dimensional MoS2 layers." ACS Nano. 8, p. 12836-12842. 2014.
Liu, et al. "Approaching the Schottky-Mott limit in van der Waals metal-semiconductor junctions". Nature. 557, pp. 696-700. 2018.
Liu, et al., "Pushing the Performance Limit of Sub-I 00 nm Molybdenum Disulfide Transistors." Nano Lett. 16, pp. 6337-6342. 2016.
Liu, et al., "Role of metal contacts in designing high-performance monolayer n-type WSe2 field effect transistors." Nano Lett. 13, pp. 1983-1990. 2013.
Liu, et al., Van der Waals metal-semiconductor junction: Weak Fermi level pinning enables effective tuning of Schottky barrier. Science Advances. 2, p. e1600069. 2016.
Louie, et al. "Electronic structure of a metal-semiconductor interface". Physical Review B. 13, pp. 2461-2469. 1976.
Ma, et al., "Carrier statistics and quantum capacitance effects on mobility extraction in two-dimensional crystal semiconductor field-effect transistors." 2D Materials. 2, p. 015003. 2015.
Michaelson. "The work function of the elements and its periodicity". Journal of Applied Physics. 48, pp. 4729-4733. 1977.
Michail, et al., "Optical detection of strain and doping inhomogeneities in single layer MoS2." Applied Physics Letters. 108, p. 173102. 2016.
Moe, et al., "Probing Evolution of Local Strain at MoS2-Metal Boundaries by Surface-Enhanced Raman Scattering." ACS Applied Materials & Interfaces. 10, pp. 40246-40254. 2018.
Nagao, et al., "Nanofilm allotrope and phase transformation of ultrathin Bi film on Si (111) 7×7." Phys. Rev. Lett. 93, p. 105501. 2004.
Nishimura, et al. "Evidence for strong Fermi-level pinning due to metal-induced gap states at metal/germanium interface". Applied Physics Letters. 91, p. 123123. 2007.
Nourbakhsh, et al., "MoS2 Field-Effect Transistor with Sub-IO nm Channel Length." Nano Letters. 16, pp. 7798-7806. 2016.
Novoselov, et al., 2D materials and van der Waals heterostructures. Science. 353, p. aac9439. 2016.
Qian, et al., "Quantum spin Hall effect in two-dimensional transition metal dichalcogenides." Science. 346, pp. 1344-1347. 2014.
Razavieh, et al. "Challenges and Limitations of CMOS Scaling for FinFET and Beyond Architectures". IEEE Transactions on Nanotechnology. 18, pp. 999-1004. 2019.
Scott, et al. "Titanium disilicide contact resistivity and its impact on 1-μm CMOS circuit performance". IEEE Transactions on Electron Devices. 34, pp. 562-574. 1987.
Smets, et al. "Ultra-scaled MOCVD MoS2 MOSFETs with 42nm contact pitch and 250μA/μm drain current". 2019 IEEE International Electron Devices Meeting (IEDM). 2019.
Smithe, et al., "High-Field Transport and Velocity Saturation in Synthetic Monolayer MoS2." Nano Letters. 18, pp. 4516-4522. 2018.
Smithe, et al., "Intrinsic electrical transport and performance projections of synthetic monolayer MoS 2 devices." 2D Materials. 4, p. 011009. 2016.
Smithe, et al., "Low Variability in Synthetic Monolayer MoS2 Devices." ACS Nano. 11, pp. 8456-8463. 2017.
Sotthewes, et al., Universal Fermi-Level Pinning in Transition-Metal Dichalcogenides. J Phys. Chem. C Nanomater. Interfaces. 123, 5411-5420, 2019.
Sze, et al. "Physics of Semiconductor Devices". John Wiley & Sons. Third Edition. 2007.
Tersoff. "Schottky Barrier Heights and the Continuum of Gap States". Phys. Rev. Lett. 52, pp. 465-468. 1984.
Thompson, et al., A 90 nm logic technology featuring 50 nm strained silicon channel transistors, 7 layers of Cu interconnects, low k ILD, and I μm/sup 2/ SRAM cell. Digest. International Electron Devices Meeting. 2002.
Tung, "The physics and chemistry of the Schottky barrier height." Applied Physics Reviews. 1. 2014. p. 11304.
Vilan, et al. "Molecular control over Au/GaAs diodes". Nature. 404, pp. 166-168. 2000.

(56) References Cited

OTHER PUBLICATIONS

Wang, et al. "Metal-2D multilayered semiconductor junctions: layer-number dependent Fermi-level pinning". Journal of Materials Chemistry C. 8, pp. 3113-3119. 2020.

Wang, et al., Van der Waals contacts between three-dimensional metals and two-dimensional semiconductors. Nature. 568, pp. 70-74. 2019.

Yang, et al. "10 nm nominal channel length $MoS_2$ FETs with EOT 2.5 nm and 0.52 mA/μm drain current". 73rd Annual Device Research Conference (DRC). 2015.

Yang, et al., "Chloride Molecular Doping Technique on 2D Materials: $WS_2$ and $MoS_2$." Nano Letters. 14, pp. 6275-6280. 2014.

Yeh, et al. "Area-Selective-CVD Technology Enabled Top-Gated and Scalable 2D-Heterojunction Transistors with Dynamically Tunable Schottky Barrier". 2019 IEEE International Electron Devices Meeting (IEDM). 2019.

Yue, et al., "Ohmic Contact in 2D Semiconductors via the Formation of a Benzyl Viologen Interlayer." Advanced Functional Materials. 29, p. 1807338. 2019.

Zhong, et al., "Interfacial Properties of Monolayer and Bilayer $MoS_2$ Contacts with Metals: Beyond the Energy Band Calculations." Sci. Rep. 6, p. 21786. 2016.

\* cited by examiner

DEVICES AND METHODS FOR CREATING OHMIC CONTACTS USING BISMUTH

CROSS REFERENCE TO RELATED APPLICATIONS

The present application claims priority to and the benefit of U.S. Provisional Patent Application No. 63/024,141, filed May 13, 2020, and titled "Devices and Methods for Creating Ohmic Contacts Using Bismuth," the contents of which are incorporated herein by reference in its entirety.

GOVERNMENT RIGHTS

This invention was made with government support under Grant No. ECCS0939514 awarded by the National Science Foundation and under Contract No. W911NF-18-2-0048 awarded by the Army Research Office. The government has certain rights in this invention.

FIELD

The present disclosure relates to semiconductor devices, including transistors, and more particularly relates to high-performance devices based on two-dimensional materials that achieve energy-barrier free, ohmic contacts by depositing bismuth on contact areas of the devices.

BACKGROUND

Since the discovery of the first working transistor in 1947, the exponential rise in the density of silicon complementary metal-oxide-semiconductor (CMOS) transistors on chips has thrust the logic performance of electronics for the humane society, the so-called Moore's law. Silicon transistors scaling, however, is now reaching its physical limits (e.g., five nanometers), threatening to end electronics advance. Silicon is considered a bulk (e.g., three-dimensional) material that exhibits a high density of dangling bonds on its surface, and nano-scaled transistors based on silicon are expected to suffer from degraded carrier mobilities, severe source-to-drain leakage current, and other short-channel effects, which make silicon-based transistors difficult to continue following Moore's law. Therefore, the semiconductor community has turned their attention to a new family of materials that promises new device concepts and architectures of transistors beyond Moore's law: two-dimensional semiconductors (e.g., 2D transition metal dichalcogenides, materials with layered structures such as silicene and germanene), which can be exfoliated to atomic layer thickness. Such thicknesses enable two-dimensional semiconductors for perfect electrostatic gate control and device scaling, and have atomic flatness and dangling-bond-free surfaces that are greatly beneficial for device integration and maintaining moderate carrier mobilities. Nevertheless, unusually high contact resistance across the interface between metal and two-dimensional semiconductors has dimmed their potential of triggering the nanoelectronics revolution due to the high Schottky barrier formed at the metal/semiconductor interfaces. In other words, to the extent efforts have been made to utilize two-dimensional materials, difficulties related to high contact resistance have precluded usage in two-dimensional semiconductors that would result in suitable semiconductor device performance.

Accordingly, there is a need for devices and methods that allow for improved device performance based on two-dimensional semiconductors while overcoming existing high energy barriers (e.g., high Schottky barriers) at the metal/semiconductor interface for semiconductor devices.

SUMMARY

The present disclosure provides for semiconductor devices (e.g., transistors) that utilize two-dimensional materials (e.g., molybdenum disulfide, tungsten diselenide) in conjunction with bismuth at the contact area(s) of the semiconductor devices. The deposition of bismuth on two-dimensional materials allows the formation of a new phase of bismuth that has a new work function different than that of other phases of bismuth deposited without the underlying two-dimensional materials. Such a new phase of bismuth, when contacted to two-dimensional materials, subsequently induces a high density of carriers on the two-dimensional material surfaces, forming degenerate surfaces, and thus reduces the contact resistance at the contact interfaces. Therefore, the use of bismuth on two-dimensional materials results in ohmic contact interfaces that are energy-barrier free, meaning that a metal/semiconductor interface exists where the current injection at the contact interface is not suppressed at all as the device temperature decreases and an ultra-low contact resistance (e.g., approximately 200 Ω·μm or less) can be achieved. This approaches the quantum limit and is at least one or two orders of magnitude lower than the typical contact resistances reported from other conventional metals (e.g., gold, titanium, platinum, nickel, and palladium). Despite the use of two-dimensional materials, the resultant semiconductor devices can provide performance levels that nearly match, match, or even exceed the high-performance of current, and possibly future, semiconductor technologies that utilize bulk materials, like silicon. The present disclosure promises advanced hardware for future technologies, such as artificial intelligence and 5G communication, where high-performance devices that exhibit high ON-current ($I_{ON}$) and ultra-low contact resistances ($R_C$) for high speed and low energy dispassion are typically highly recommended or needed. In alternative embodiments, instead of bismuth, or in addition to bismuth, antimony and/or arsenic can be used. Throughout this application, unless specified otherwise, antimony and/or arsenic can be used in lieu of, or in addition to, bismuth. Accordingly, there is no need to mention these other materials when describing embodiments that include bismuth. Further, in some instances, an electrical contact(s) can be configured to induce gap-state saturation.

More particularly, the methods disclosed herein achieve energy-barrier free, ohmic contacts for high-performance devices that can achieve high ON-current ($I_{ON}$) and ultra-low contact resistance ($R_C$) based on two-dimensional (2D) materials. The disclosure also provides for the devices themselves, e.g., transistors. As provided for herein, a new phase of bismuth with a layer-like structure can be formed when the deposition of bismuth is implemented on the surface of 2D materials. The work function of such a new phase of bismuth can depend, at least in part, on the morphology of the underlying 2D material substrate, and can be different than that of other phases of bismuth deposited without the underlying 2D materials. In the case of molybdenum disulfide ($MoS_2$), the work function of the new phase of bismuth decreases about 0.5 eV. As a result, a significantly high density of carriers can be induced in $MoS_2$ at a metal/semiconductor contact interface by depositing bismuth (Bi) on semiconductor contact areas of such materials. Therefore, an energy-barrier free, degenerate interface for true ohmic contacts can be generated. Such ohmic contact device characteristics can be maintained even at low temperatures. This can enable an ultralow-contact resistance approaching the quantum limit for high-performance devices (e.g., transistors, high-power electronics, high-frequency devices, spintronics). Such methods to achieve an energy-barrier-free, ohmic contact to 2D materials has not been reported from any other types of conventional metals, such as gold, titanium, platinum, nickel, and palladium. The result of these methods and devices is record-high-ON current ($I_{ON}$) transistors based on 2D monolayer semiconductors. Further, because the methods and devices disclosed herein do not require any intentional doping such as physical/chemical absorption of molecules, lithium intercalation, plasma irradiation, and/or ion implementation processes, the resulting fabrication processes, devices, and performances are highly reliable and cost-effective with respect to the device yield, reliability, and process integration.

Compared with existing technology and techniques regarding contacts to two-dimensional materials (e.g., molybdenum disulfide and tungsten diselenide), the present methods represent a new type of contact method in which a degenerate interface is successfully formed at the 2D semiconducting channel/bismuth contact interface by depositing bismuth on the surface of the 2D materials to form a new phase of bismuth with much lower work function. To date, bismuth does not appear to have been employed as the electrical contacts to field-effect transistors based on two-dimensional materials. The methods and devices provided for herein can be applied to a variety of industries, including but not limited to next-generation transistors, high-power electronics, high-frequency devices, memory devices, spintronics, and photonic devices for the semiconductor industry.

In one exemplary embodiment a semiconductor device includes one or more electrical contacts, with at least one electrical contact of the one or more electrical contacts including bismuth. In another exemplary embodiment a semiconductor device includes one or more electrical contacts, with at least one electrical contact of the one or more electrical contacts including antimony. In still another exemplary embodiment a semiconductor device includes one or more electrical contacts, with at least one electrical contact of the one or more electrical contacts including arsenic. In yet another exemplary embodiment a semiconductor device includes one or more electrical contacts, and at least one electrical contact of the one or more electrical contacts is configured to induce gap-state saturation. Stated in an alternative manner, in one exemplary embodiment a semiconductor device includes one or more electrical contacts, with at least one electrical contact of the one or more electrical contacts including one or more of bismuth, antimony, or arsenic. In at least some embodiments, the at least one electrical contact of the one or more electrical contacts can be configured to induce gap-state saturation.

In at least some embodiments, the semiconductor device can include a two-dimensional material, with the at least one electrical contact that includes bismuth (and/or antimony and/or arsenic, as appropriate) being disposed on the two-dimensional material. The two-dimensional material can have a thickness approximately in the range of about 0.3 nanometers to about 100 nanometers. A contact resistance of the electrical contact(s) that includes bismuth can be approximately in the range of about 10 $\Omega\mu m$ to about 200 $\Omega\mu m$. The electrical contact(s) that includes bismuth can include a bismuth/2D material stack (or antimony/2D material stack or arsenic/2D material stack, as appropriate). The electrical contact(s) that includes bismuth (and/or antimony and/or arsenic, as appropriate) can be energy-barrier free. Still further, the electrical contact(s) that includes bismuth (and/or antimony and/or arsenic, as appropriate) can be ohmic.

The two-dimensional material can include one or more materials with layered structures. The layered structures can include one or more transition metal dichalcogenides, indium telluride, silicene, germanene, diamondene, gallium oxide, and/or combinations of such materials. In embodiments in which the layered structures include one or more transition metal dichalcogenides, non-limiting examples of such transition metal dichalcogenides include molybdenum disulfide, molybdenum diselenide, tungsten disulfide, tungsten diselenide, and/or heterostructures of such materials. In embodiments in which the transition metal dichalcogenide(s) includes molybdenum disulfide, the molybdenum disulfide can include a monolayer, a few layers (also referred to as "a few-layer") (e.g., approximately in the range of about two layers to about six layers, although more layers are possible), and/or multilayers. In some embodiments, the transition metal dichalcogenide(s) can include two-dimensional thin films and/or individual flakes.

The semiconductor device can include a transistor. The transistor can include a gate end, a source end, and a drain end, as well as the two-dimensional material, with the electrical contact(s) that include bismuth (and/or antimony and/or arsenic, as appropriate) being disposed on the two-dimensional material. The source end and the drain end can be located on the two-dimensional material and the gate end can be located between the source end and the drain end. In some embodiments, the transistor can include a field-effect transistor. The field-effect transistor can include a dielectric layer coupled to the two-dimensional material and a gate that is coupled to the dielectric layer. The dielectric layer can be located between the gate and the two-dimensional material. Some non-limiting examples of types of field-effect transistors that can have these configurations include one or more of: a beyond Moore transistor, a metal-oxide-semiconductor field-effect transistor, a tunnel field-effect transistor, a ferroelectric negative capacitance field-effect transistor, a junction field-effect transistor, a fin field-effect transistor, a gate-all-around field effect transistor, a multi-bridge-channel field-effect transistor, a vertically-stacked field effect transistor, a spin field-effect transistor, or a photovoltage field-effect transistor. In some embodiments in which the semiconductor includes a transistor, an ON-current of the transistor can be approximately in the range of about 450 $\mu A\mu m^{-1}$ to about 2 $mA\mu m^{-1}$. In some other embodiments in which the semiconductor includes a transistor, an ON-current of the transistor can be approximately in the range of about 500 $\mu A\mu m^{-1}$ to about 1135 $\mu A\mu m^{-1}$.

One exemplary method of manufacturing an ohmic contact semiconductor device includes depositing bismuth on an electrical contact area where a two-dimensional material disposed on a supporting substrate of a semiconductor device is exposed for bismuth deposition. This results in forming ohmic contact. Another exemplary method of manufacturing an ohmic contact semiconductor device includes depositing antimony on an electrical contact area where a two-dimensional material disposed on a supporting substrate of a semiconductor device is exposed for antimony deposition. This results in forming ohmic contact. Still another exemplary method of manufacturing an ohmic contact semiconductor device includes depositing arsenic on an electrical contact area where a two-dimensional material disposed on a supporting substrate of a semiconductor device is exposed for arsenic deposition. Yet another exemplary method of manufacturing an ohmic contact semiconductor device includes configuring at least one electrical contact of a semiconductor device to induce gap-state saturation. Stated in an alternative manner, in one exemplary embodiment of a method of manufacturing an ohmic contact semiconductor device, the method includes depositing one or more of bismuth, antimony, or arsenic on an electrical contact area where a two-dimensional material disposed on a supporting substrate of a semiconductor device is exposed for bismuth deposition to form ohmic contact. In at least some embodiments, the method can further include configuring at least one electrical contact of a semiconductor device to induce gap-state saturation.

The semiconductor device can be a transistor. In at least some embodiments, the transistor can be a field-effect transistor. Some non-limiting examples of types of field-effect transistors that can be used in conjunction with the method(s) include one or more of: a beyond Moore transistor, a metal-oxide-semiconductor field-effect transistor, a tunnel field-effect transistor, a ferroelectric negative capacitance field-effect transistor, a junction field-effect transistor, a fin field-effect transistor, a gate-all-around field effect transistor, a multi-bridge-channel field-effect transistor, a vertically-stacked field effect transistor, a spin field-effect transistor, or a photovoltage field-effect transistor. In some embodiments in which the semiconductor includes a transistor, an ON-current of the transistor can be approximately in the range of about 450 µAµm$^{-1}$ to about 2 mAµm$^{-1}$. In some other embodiments in which the semiconductor includes a transistor, an ON-current of the transistor can be approximately in the range of about 500 µAµm$^{-1}$ to about 1135 µAµm$^{-1}$.

The bismuth (and/or antimony and/or arsenic as appropriate) can be deposited on at least the two-dimensional material. The two-dimensional material can include one or more materials with layered structures. The layered structures can include one or more transition metal dichalcogenides, indium telluride, silicene, germanene, diamondene, gallium oxide, and/or combinations of such materials. In embodiments in which the layered structures include one or more transition metal dichalcogenides, non-limiting examples of such transition metal dichalcogenides include molybdenum disulfide, molybdenum diselenide, tungsten disulfide, tungsten diselenide, and/or heterostructures of such materials. In embodiments in which the transition metal dichalcogenide(s) includes molybdenum disulfide, the molybdenum disulfide can include a monolayer, a few layers (e.g., approximately in the range of about two layers to about six layers, although more layers are possible), and/or multilayers. In some embodiments, the transition metal dichalcogenide(s) can include two-dimensional thin films and/or individual flakes.

The ohmic contact can have a contact resistance that is approximately in the range of about 10 Ωµm to about 200 Ωµm. The ohmic contact can be energy-barrier free.

BRIEF DESCRIPTION OF THE DRAWINGS

This disclosure will be more fully understood from the following detailed description, taken in conjunction with the accompanying drawings, in which.

DETAILED DESCRIPTION

Figure 1A:
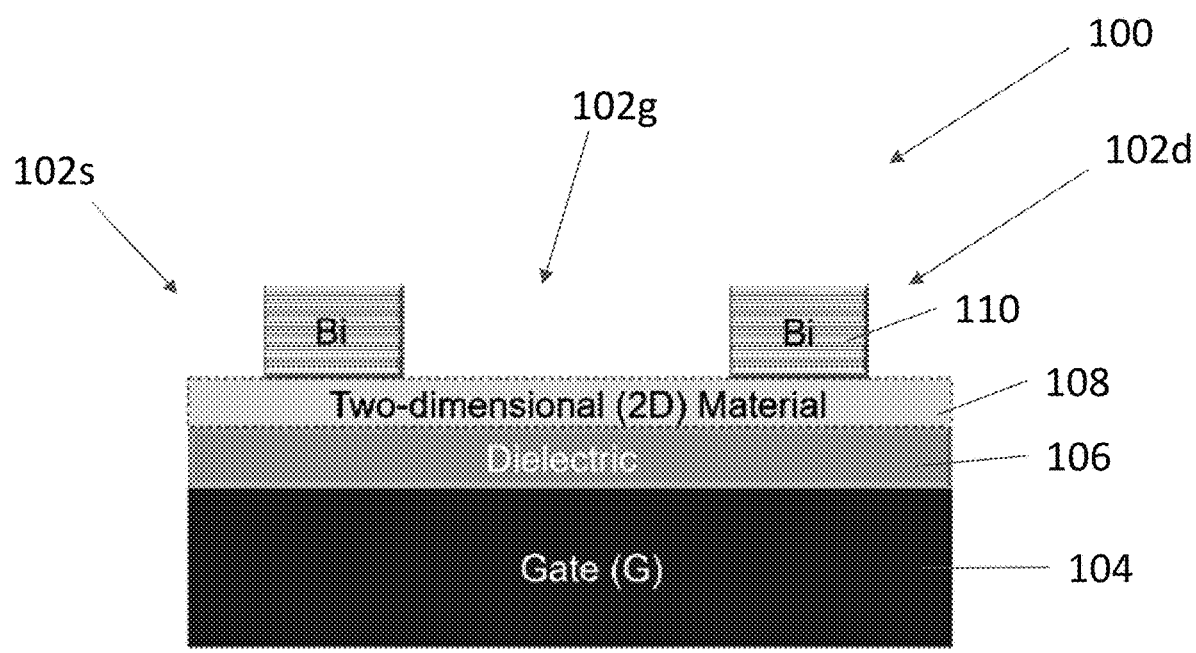
FIG. 1A is a schematic front view of one exemplary embodiment of a low-contact resistance, ohmic contact field-effect transistor.

Certain exemplary embodiments will now be described to provide an overall understanding of the principles of the structure, function, manufacture, and use of the devices and methods disclosed herein. One or more examples of these embodiments are illustrated in the accompanying drawings. Those skilled in the art will understand that the devices and methods specifically described herein and illustrated in the accompanying drawings are non-limiting exemplary embodiments and that the scope of the present disclosure is defined solely by the claims. The features illustrated or described in connection with one exemplary embodiment may be combined with the features of other embodiments. Such modifications and variations are intended to be included within the scope of the present disclosure. Further, to the extent features, sides, objects, steps, or the like are described as being "first," "second," "third," etc., such numerical ordering is generally arbitrary, and thus such numbering can be interchangeable. Likewise, to the extent features are described as being disposed on top of, below, next to, etc. such descriptions are typically provided for convenience of description, and a person skilled in the art will recognize that, unless stated or understood otherwise, other locations and positions are possible without departing from the spirit of the present disclosure. Still further, the present disclosure includes some illustrations and descriptions that include prototypes or bench models. A person skilled in the art will recognize how to rely upon the present disclosure to integrate the techniques, systems, devices, and methods provided for into a product.

The present disclosure provides for improved semiconductor devices (e.g., transistors, such as field-effect transistors) by implementing the use of bismuth (Bi) (and/or antimony and/or arsenic in some instances) at the electrical contacts for such semiconductor devices that are based on two-dimensional materials. A two-dimensional material is material that has one of the dimensions thin enough (e.g., on a scale of a few nanometers or less) for confining the motion of charged carriers (e.g., electron or hole), leading to quantum confinement effect, making the physical properties of the material affected by the confinement, different than its bulk counterpart. The bismuth (and/or antimony and/or arsenic as appropriate) contacts allow for energy-barrier free, ohmic contacts to be achieved for high-performance devices (e.g., field-effect transistors) based on two-dimensional materials (e.g., molybdenum disulfide, indium telluride). Ohmic contacts are non-rectifying electrical junctions exhibiting a low contact resistance, such junctions being between two conductors and having a linear current-voltage curve even at low temperatures (e.g., about 77 K or less). The linear curve is consistent with Ohm's law, but such linearity was not achieved in existing two-dimensional semiconductors at a low device operating temperature that utilize conventional metals such as gold, titanium, platinum, nickel, and palladium for contacts. Such an energy-barrier free, ohmic contact does not suppress the current injection at the metal/semiconductor interface as the device operating temperature decreases, and exhibits an ultra-low contact resistance of about 200 Ω·µm or less approaching the quantum limit. A person skilled in the art will recognize that low resistance ohmic contacts can be beneficial at least because the extra resistance at the contact can contribute to extra power consumption when the device(s) is under operation. In some embodiments, low resistance constitutes an approximate range of values between about 10 Ω·µm and about 200 Ω·µm, although a person skilled in the art will appreciate that these values depend, at least in part, on the gate efficiency of the device, and such values can vary, for example, with the carrier density induced in the transistor channel. 10 Ω·µm is the quantum limit when carrier density is approximately 10$^{14}$ cm$^{-2}$. In contrast, the contact interface of existing semiconductor devices based on 2D materials are typically non-ohmic, as they utilize, for example, p-n junctions, Schottky barrier junctions, and van der Waals tunneling barrier junctions, where the current injection is impeded by energy barriers at the contact interfaces and is greatly suppressed at low temperatures.

The electrical contact resistance at a metal-semiconductor (M-S) interface has been an increasingly critical, yet unsolved issue for the semiconductor industry, hindering the ultimate scaling and the performance of electronic devices. The main cause of this electrical contact resistance is that an energy barrier, called Schottky barrier (SB), forms between the metal electrode and semiconductor, due, at least in part, to: (I) the energy difference between the metal work function and the semiconductor electron affinity; and (II) metal-induced gap states (MIGS) resulting in Fermi level pinning. When a semiconductor is in close proximity to a metal surface, the extended wavefunction from the metal perturbs the environment of the semiconductor, leading to rehybridization of semiconductor's original wavefunctions. MIGS is a result of such perturbation, where new states in resonance with the metal states emerge in the band gap, as compared to the original density of states (DOS) of $MoS_2$ before contact. The present disclosure reduces contact resistance by suppressing MIGS using semimetal-semiconductor contacts to avoid gap state separation.

The present disclosure helps solve challenging contact issues that exist for achieving high-performance devices that are based on two-dimensional materials in the semiconductor industry, including transistors for digital logic, high-power devices, and high-frequency devices. For example, as described herein, monolayer molybdenum disulfide ($MoS_2$), one of the thinnest 2D semiconductors known (e.g., approximately 0.65 nanometers), is able to achieve energy-barrier free, ohmic contacts in view of the present disclosure. More particularly, high-performance monolayer $MoS_2$ transistors with a barrier-free, ohmic interface are described below, in which the transistor ON-current ($I_{ON}$), a figure-of-merit in transistor scaling, is only dominated by the $MoS_2$ channel resistance itself, instead of the contact resistance. This feature enables further aggressive downscaling of transistors based on two-dimensional materials to achieve high ON-state current for logic, high-power, and high-frequency devices used in current and likely future artificial intelligence and 5G communication technologies. The techniques disclosed herein result in a record high $I_{ON}$, for example greater than approximately 1135 $\mu A \mu m^{-1}$ with a 35 nm channel device and greater than approximately 1005 $\mu A \mu m^{-1}$ with a 50 nm channel device at a relatively low drain bias (approximately 1.5 V) for a single-layer $MoS_2$ n-type field-effect transistor(s) at room temperature. These techniques allow for zero Schottky barrier height, a record-low contact resistance (RC) of 123 $\Omega \mu m$, and a record-high on-state current density ($I_{ON}$) of 1135 $\mu A \mu m^{-1}$ on monolayer $MoS_2$. The present disclosure pushes the frontier of semiconductor device technology and may bridge the gap between 2D semiconductors and the requirement for the cutting-edge ultra-scaled transistor technology.

Figure 1B:
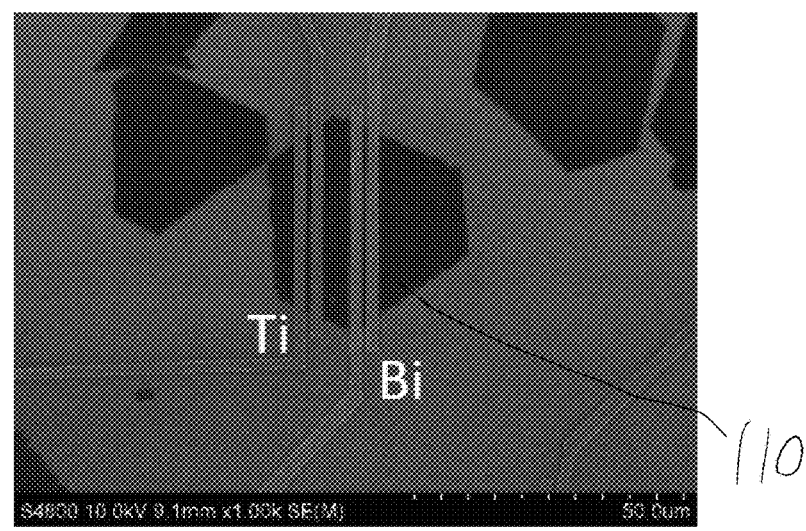
FIG. 1B illustrates a scanning electron microscope (SEM) image that shows a monolayer MoS$_2$ contacted by bismuth.

FIG. 1A illustrates one exemplary embodiment of a low-contact resistance, ohmic contact field-effect transistor 100 that uses bismuth. The transistor 100 includes a gate end 102g, a source end 102s, and a drain end 102d, a gate 104, a dielectric 106 disposed next to (as shown, on top of) the gate 104, and a two-dimensional material 108, also referred to as a two-dimensional material channel, disposed next to (as shown, on top of) the dielectric. As shown, the source end 102s and the drain end 102d are located on the two-dimensional material 108 and the gate end 102g is located between the source end 102s and the drain end 102d. The dielectric 106, or dielectric layer, can be coupled to the two-dimensional material 108, and the gate 104 can be coupled to the dielectric 106. As shown, the dielectric layer 106 can be located between the gate 104 and the two-dimensional material 108. One or more bismuth contacts 110 are disposed on (as shown, on top of) the two-dimensional material channel 108. A scanning electron microscope (SEM) image that shows a monolayer $MoS_2$ contacted by bismuth 110 is shown in FIG. 1B. A scanning transmission electron microscope (STEM) cross-sectional image is provided in FIG. 4E.

Figure 2A:
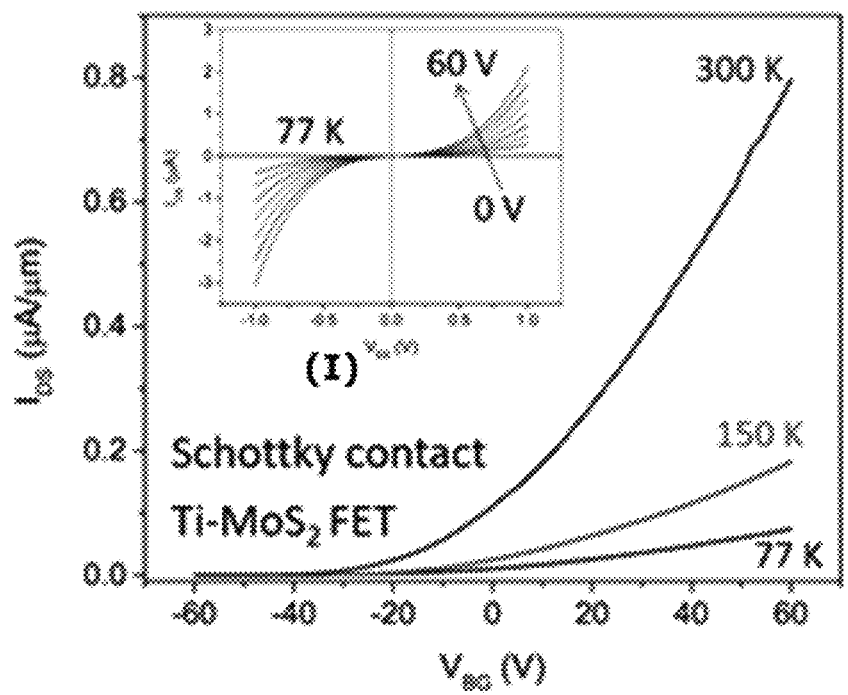
FIG. 2A is a graph showing transfer and output characteristics of monolayer MoS$_2$ transistors that use titanium contacts at different temperatures.
Figure 2B:
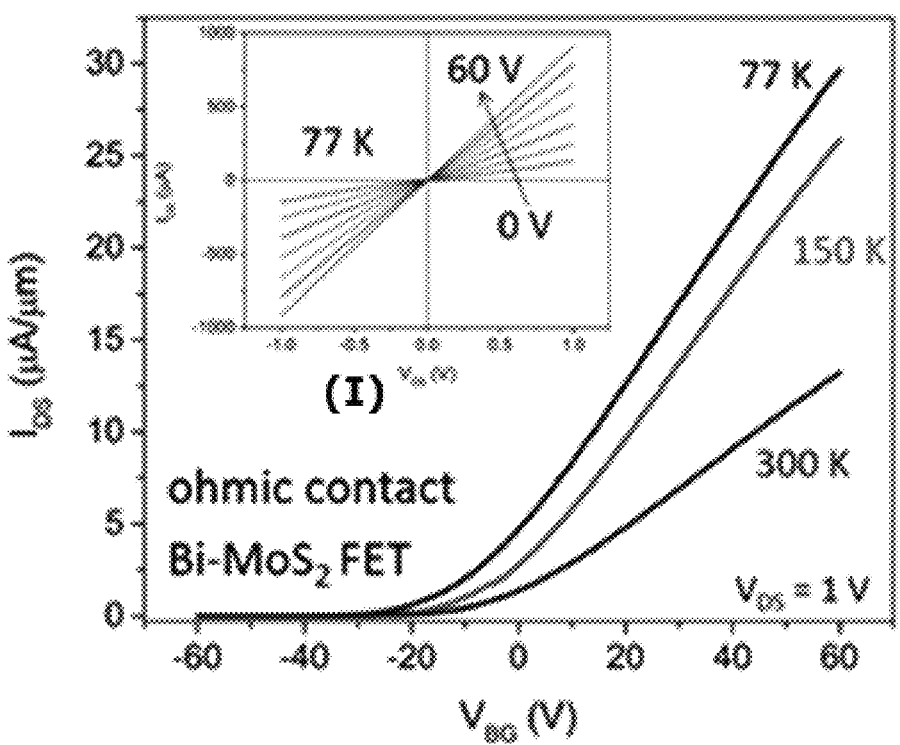
FIG. 2B is a graph showing transfer and output characteristics of monolayer MoS$_2$ transistors that use bismuth contacts at different temperatures.
Figure 2C:
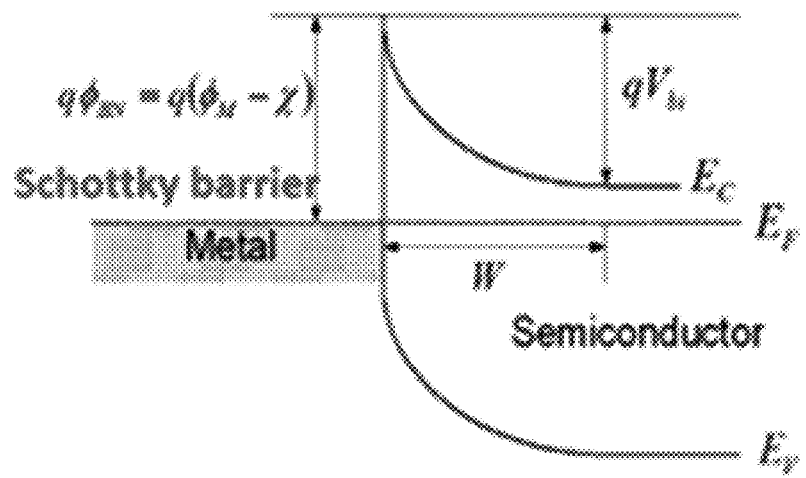
FIG. 2C is a graph showing a comparison of energy band diagrams for conventional contacts.

FIGS. 2A-2D illustrate the ohmic contact transistor performance enabled by the use of bismuth at the contact area(s) of the transistor 100 of FIG. 1. More particularly, the images of FIGS. 2A and 2B allow for a comparison of the transfer and output characteristics of monolayer $MoS_2$ transistors that use conventional contact techniques such as titanium contacts and those that use bismuth contacts at different temperatures. As shown, the bismuth-contact transistor exhibits a much higher on-current at the same device structures and dimensions and ohmic characteristics (e.g., inset, linear current-voltage responses (I)) even at low temperatures (e.g., 77 K). FIG. 2B demonstrates that the current injection at the bismuth/semiconductor contact interfaces is not suppressed as the device temperature decreases, indicating no energy barrier at the interface (e.g., inset, linear current-voltage responses (I)). In contrast, FIG. 2A illustrates that the current injection is significantly suppressed at low temperatures when conventional contact techniques are employed because energy barriers exist at the contact interfaces of the devices. Further, the images of FIGS. 2C and 2D allow for a comparison of energy band diagrams for conventional contacts (e.g., gold, titanium, platinum, nickel, palladium) and bismuth contacts. As shown, the conventional contacts result in a Schottky barrier at the contact interface that impedes electron injection, while the bismuth contacts result in a degenerate (accumulation type) interface, also referred to as a barrier-free interface. That is, the 2D $MoS_2$/bismuth interface is barrier-free and ohmic, in contrast to existing transistor interfaces. FIG. 4D, discussed further below having FIG. 2C as inset (I), illustrates the electrical characteristics of existing transistor interfaces.

Figure 3A:
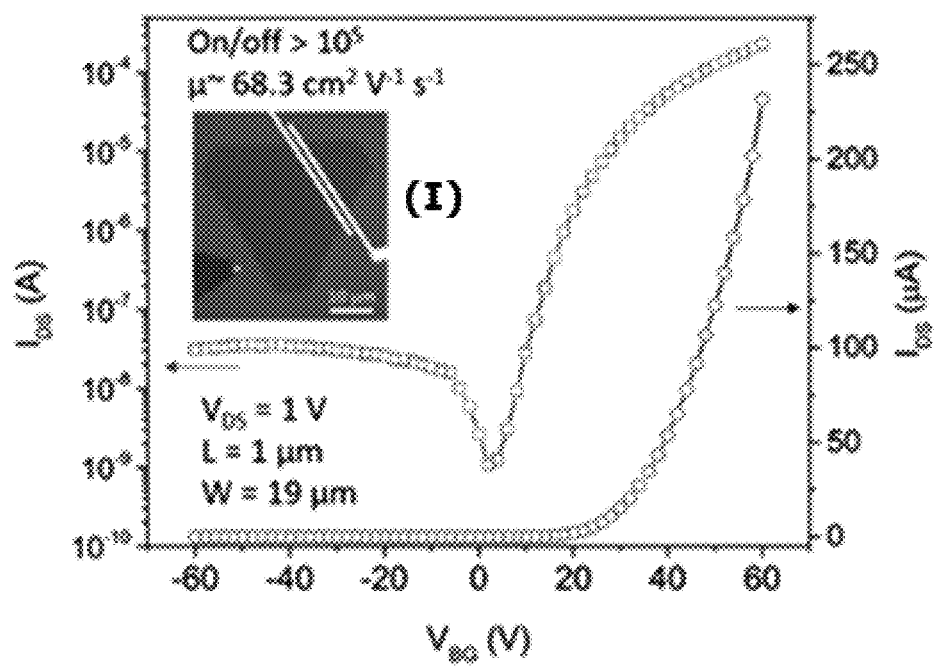
FIG. 3A is a graph showing high-electron-mobility capabilities of monolayer MoS$_2$ transistors.
Figure 3B:
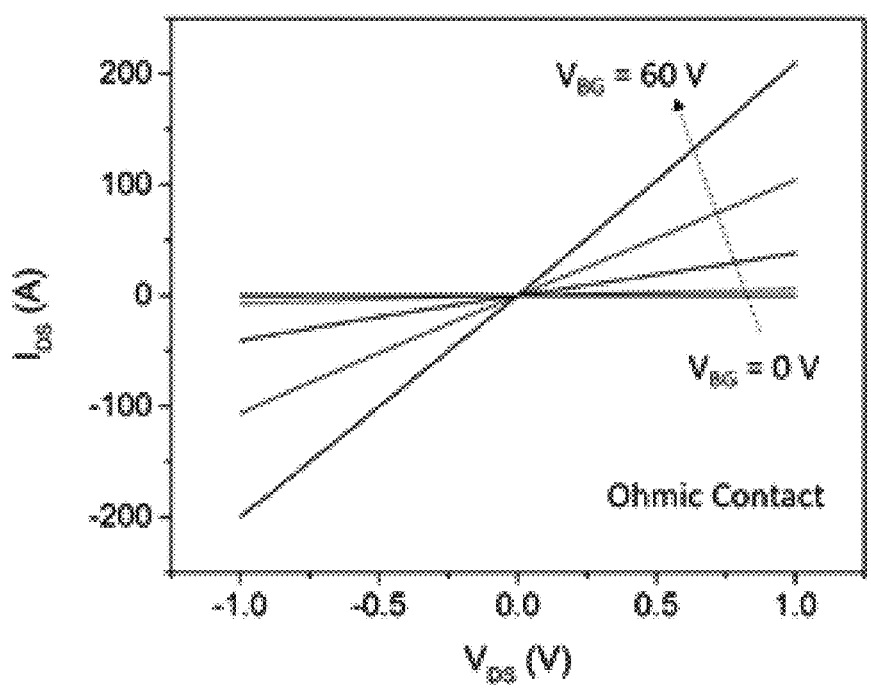
FIG. 3B is a graph showing a linear relationship of drain current-to-drain voltage ($I_{DS}$-$V_{DS}$)

FIGS. 3A-3B demonstrates the high-electron-mobility capabilities of monolayer $MoS_2$ transistors as provided for herein at room temperature, with the monolayer being shown in the inset (I) of FIG. 3A. As shown, because the effect of contact resistance is almost negligible in the bismuth-contacted device, a high performance of a high electron mobility at room temperature of approximately 68 $cm^2 V^{-1} s^{-1}$ extracted from the current-gate voltage ($I_{DS}$-$V_{BG}$) can be achieved in the device. The linear relationship of current-to-drain voltage ($I_{DS}$-$V_{DS}$) can manifest that the ohmic contacts are formed and the output characteristic of the bismuth-contacted device can follow Ohm's law.

Figure 4A:
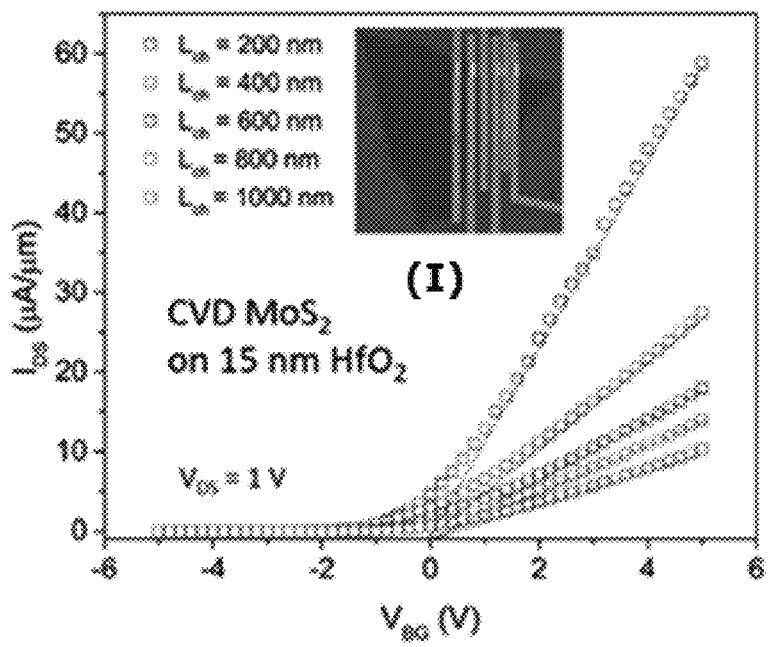
FIG. 4A is a graph showing electrical characterization of ultra-low contact-resistance transistors having various channel lengths.
Figure 4B:
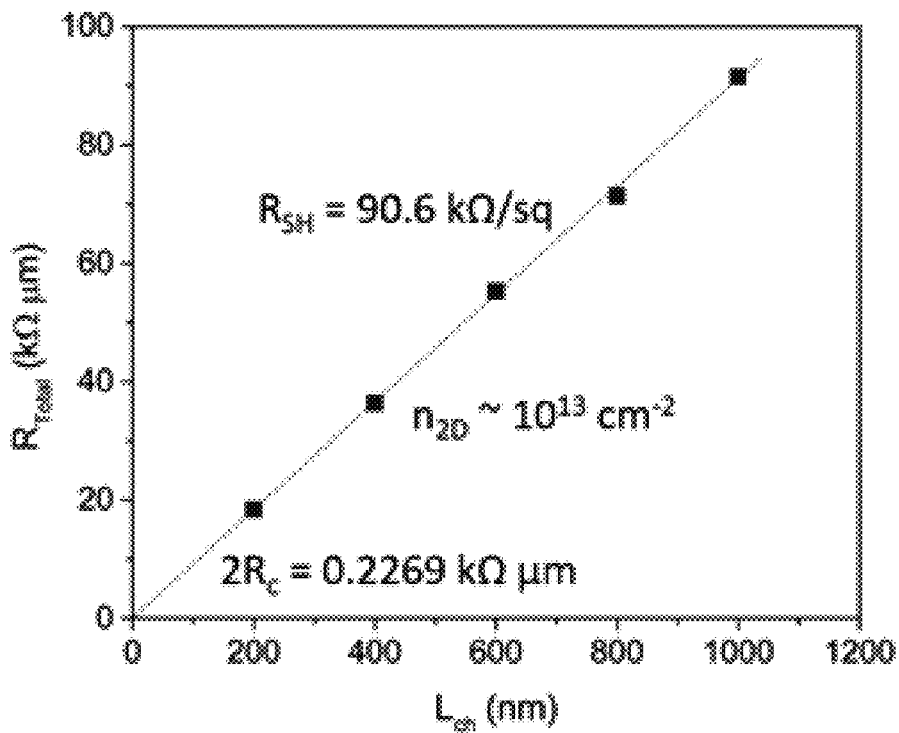
FIG. 4B is a graph showing an ultra-low contact resistance of bismuth electrodes on monolayers MoS$_2$ of an ohmic contact transistor extracted by the transfer-length-method (TLM)
Figure 4C:
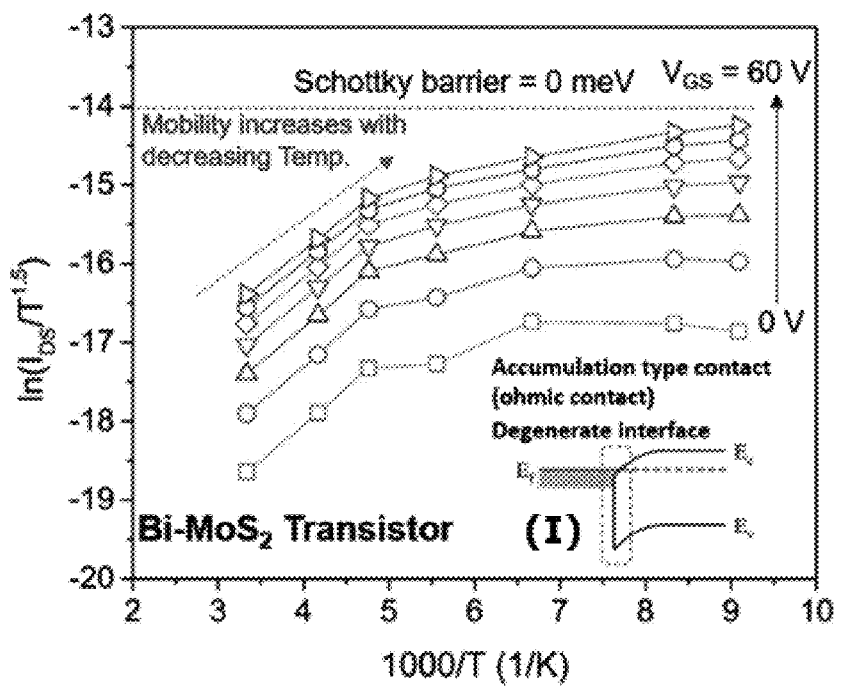
FIG. 4C is a graph showing degenerate (accumulation)-type interfaces at Bi/MoS$_2$ interfaces.
Figure 4D:
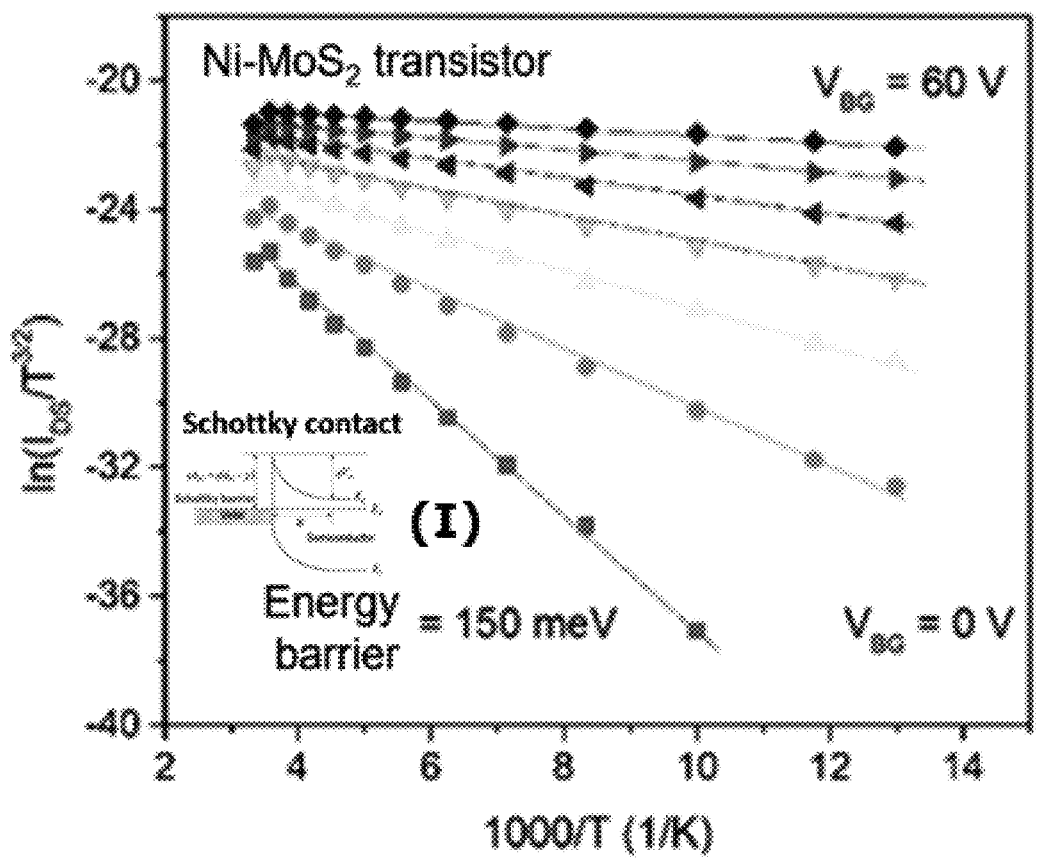
FIG. 4D is a graph showing the electrical characteristics of existing transistor interfaces.
Figure 4E:
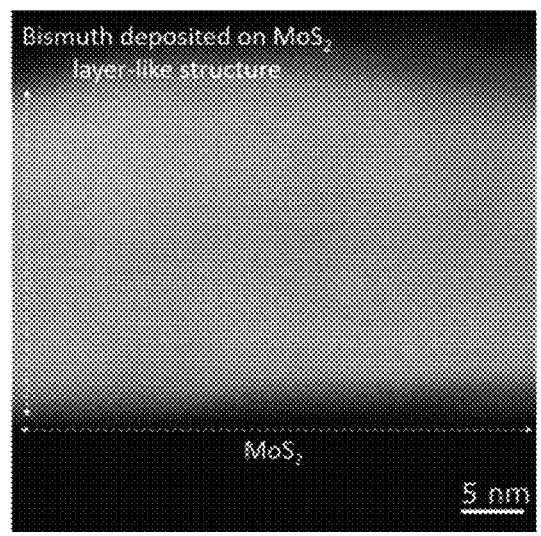
FIG. 4E illustrates a cross-sectional scanning transmission electron microscope (STEM) image of a new phase pf bismuth in a layer-like structure.
Figure 4F:
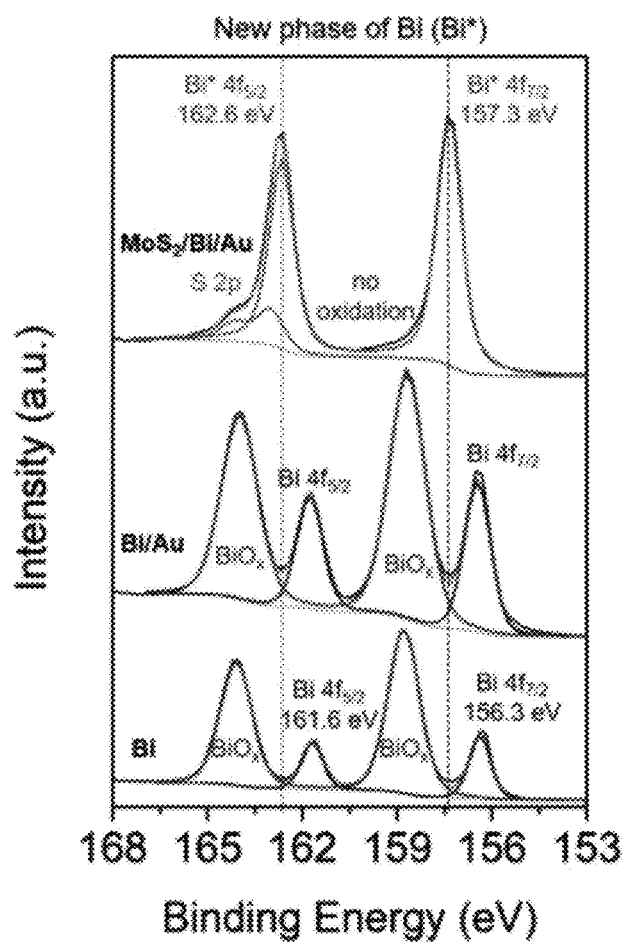
FIG. 4F is a graph showing formation of a new phase of bismuth deposited on 2D MoS$_2$ for an ohmic contact interface as confirmed by X-ray photoelectron spectroscopy (XPS)

FIGS. 4A-4G illustrate additional benefits of ultra-low contact-resistance, ohmic contact transistors based on monolayer $MoS_2$, as provided for herein, and barrier-free, degenerate metal/semiconductor interfaces, as also provided for herein. More particularly, FIG. 4A provides for an electrical characterization of ultra-low contact-resistance transistors (e.g., monolayer $MoS_2$ transistors) having various channel lengths. As shown, the ON-current ($I_{ON}$) of the device clearly varies with the channel lengths, with the channels being shown in inset (I), indicating the total resistance (sum of contact and channel resistances) of the device is mainly dominated by the channel resistance, instead of the contact resistance.

FIG. 4B illustrates an ultra-low contact resistance of bismuth electrodes on monolayers $MoS_2$ of an ohmic contact transistor extracted by the transfer-length-method (TLM). A contact resistance resulting from the present disclosures can approach, or even reach, values achievable by silicon technology and the quantum limit. For example, in some embodiments, a contact resistance can be approximately in the range of about 10 $\Omega \mu m$ (which is the approximate value of the quantum limit at a carrier density of about $10^{14}$ $cm^{-2}$) to about 200 $\Omega \mu m$, although other contact resistances above and below those amounts are possible, for example by further optimization of the fabrication process. As shown, total resistances of the devices ($R_{total}$) normalized by the channel width versus channel lengths ($L_{ch}$) measured at a carrier density ($n_{2D}$) of approximately $10^{13}$ $cm^{-2}$ results in a residual resistance of approximately 200 $\Omega \mu m$. This result essentially purely originates from the two contacts when the channel resistance is 0 $\Omega \mu m$ ($L_{ch}$=0 nm). Therefore, the contact resistance ($R_C$) for each individual contact interface in the device is about 100 Ω μm.

Figure 2D:
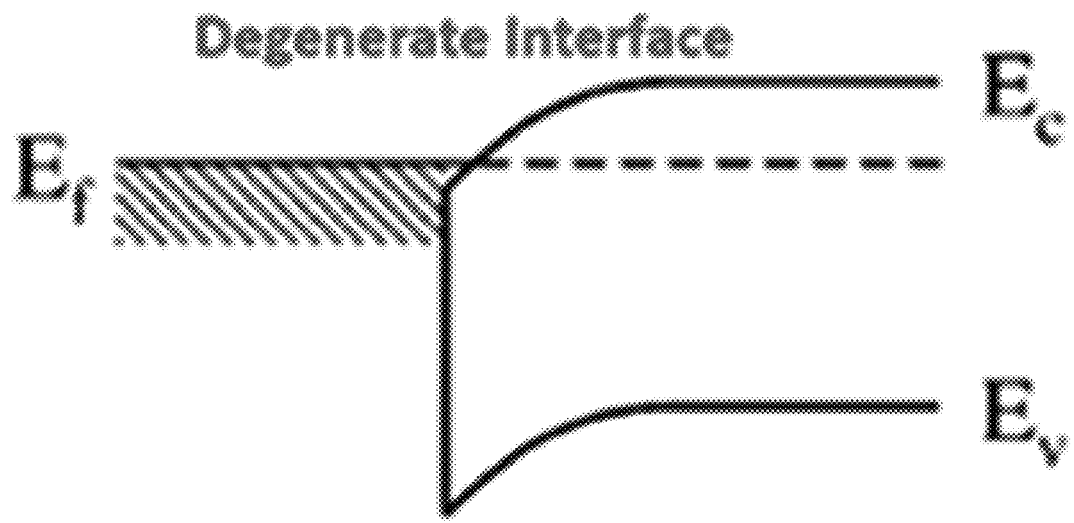
FIG. 2D is a graph showing a comparison of energy band diagrams for bismuth contacts.

Still further, based on a thermionic emission model, FIG. 4C, also known as Arrhenius plot, illustrates degenerate (accumulation)-type interfaces at Bi/MoS$_2$ interfaces, with FIG. 2D being included as inset (I). As shown, for an ideal transistor without energy barrier, the contact interface, that is, ohmic contact, in view of the thermionic emission model yields a zero slope for the Arrhenius plots when the channel mobility is assumed to be unchanged at all the temperatures. However, in reality, the MoS$_2$ mobility typically increases when temperature decreases due, at least in part, to the reduced phonon scattering, which contributes to the increase in $I_{ON}$ ($=n_{2D}q\mu\varepsilon$). Therefore, the positive slopes within the range of about 300 K to about 150 K in the Arrhenius plots originate from the mobility enhancement of the MoS$_2$ channel. Once the channel mobility gradually reaches a constant in the range of about 150 K to about 77 K, the slopes of the Arrhenius plots tend to saturate, behaving as ideal, energy-barrier free transistors. In contrast, for typical Schottky contact transistors using conventional metals such as nickel and titanium as the contacts, the Arrhenius plots yield negative slopes corresponding to the effective energy barriers at the metal/MoS$_2$ interface, indicating that barrier-free, ohmic contact interfaces are not able to be formed by conventional common electrode materials (e.g., gold, titanium, platinum, nickel, and palladium).

A new phase of bismuth (Bi) having a work function lower (higher) than the conduction (valence) band edge of the 2D semiconducting channel material (e.g., 2D or layered materials such as MoS$_2$, WSe$_2$, and boron nitride) can be formed when deposited on 2D materials. The Bi/MoS$_2$ interfaces of the present disclosure exhibit strain and high carrier concertation (approximately $10^{13}$ cm$^{-2}$) without implementing extra deliberate surface modifications to form ohmic contacts. The energy-barrier free, ohmic contact interface is achieved by forming such new phase of bismuth at the contact interfaces. This new phase of bismuth is a layer-like structure, as characterized by the cross-sectional scanning transmission electron microscope (STEM) image shown in FIG. 4E. The formation of the new phase of bismuth deposited on 2D MoS$_2$ for the ohmic contact interface is also confirmed by X-ray photoelectron spectroscopy (XPS), shown in FIG. 4F, in which a clear shift in the binding energies can be observed for the new phase of bismuth as compared to both pure bulk bismuth and bismuth that are deposited without the underlying MoS$_2$.

Figure 4G:
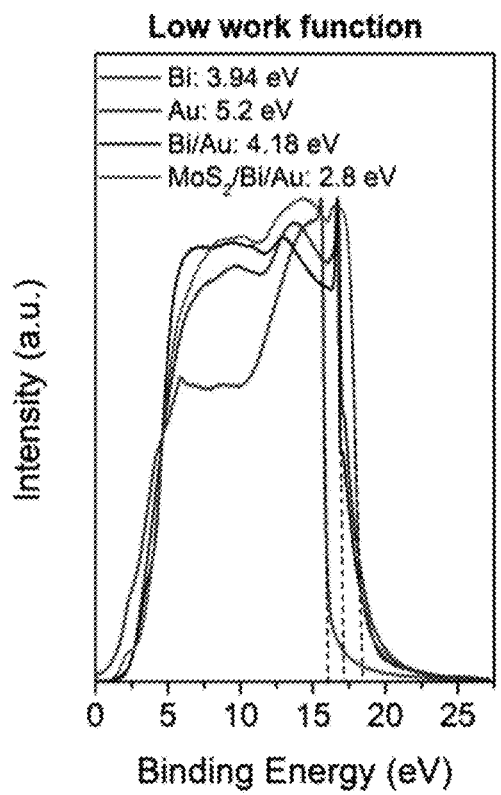
FIG. 4G is a graph showing ultraviolet photoelectron spectroscope (UPS) of a new phase of epitaxial bismuth with low work function grown on MoS$_2$.

FIG. 4G illustrates the ultraviolet photoelectron spectroscope (UPS) of the new phase of epitaxial bismuth grown on MoS$_2$, showing that the new phase of bismuth exhibits a much lower work function compared to both pure bismuth only and bismuth deposited without the underlying MoS$_2$. This method for achieving a new phase of metal with adjustable work functions by depositing bismuth on the surfaces of two-dimensional materials for electrically ohmic contacts of high-performance devices has not been reported before. All results are marked improvements compared to conventional metal/MoS$_2$ interfaces and/or through electrical gating. As evidenced by the results, the present devices and methods are capable of meeting future International Technology Roadmap for Semiconductors (ITRS) requirements. For example, the ITRS 2027 target requires a contact resistance as low as approximately 122 Ω μm for achieving high ON-current ($I_{ON}$) of approximately 878 mA mm$^{-1}$ and 387 mA mm$^{-1}$ for high- and low-performance logic transistors, respectively.

Figure 5A:
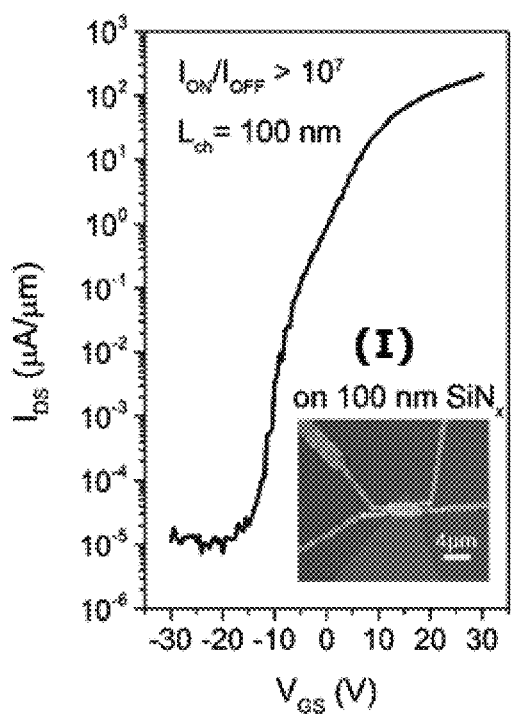
FIG. 5A is a graph showing high-performance n-type field-effect transistors based on synthetic monolayer MoS$_2$ with a high $I_{ON}/I_{OFF}$ ratio.
Figure 5B:
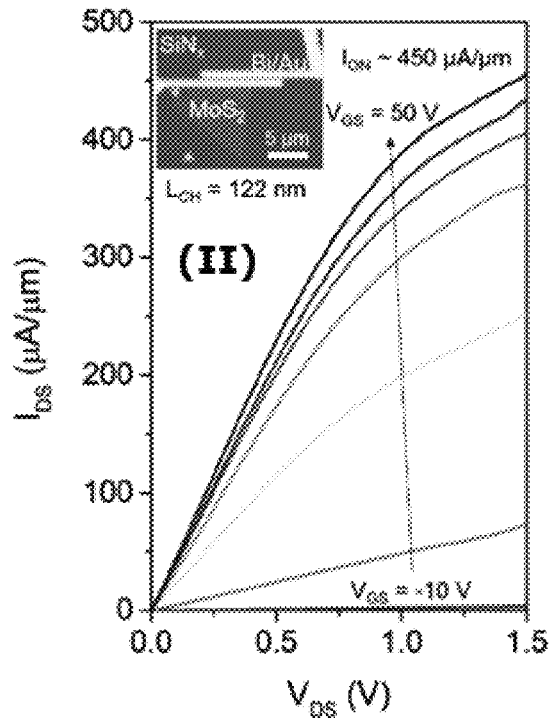
FIG. 5B is another graph showing high-performance n-type field-effect transistors based on synthetic monolayer MoS$_2$ with a high ON-current density (e.g., $I_{ON}$, or drain current density)
Figure 5C:
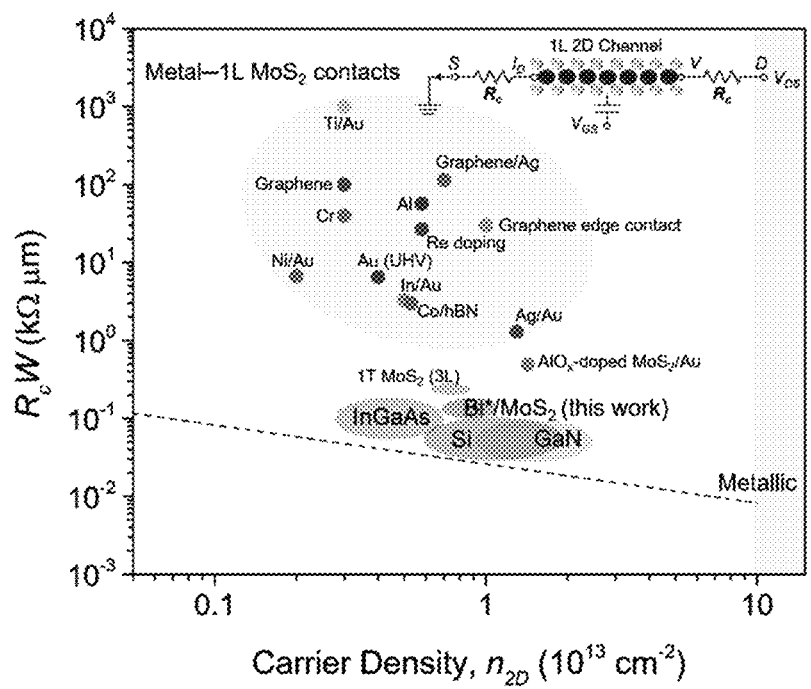
FIG. 5C is a graph showing contact resistances of the transistor of FIG. 5A as compared to various metals.
Figure 5D:
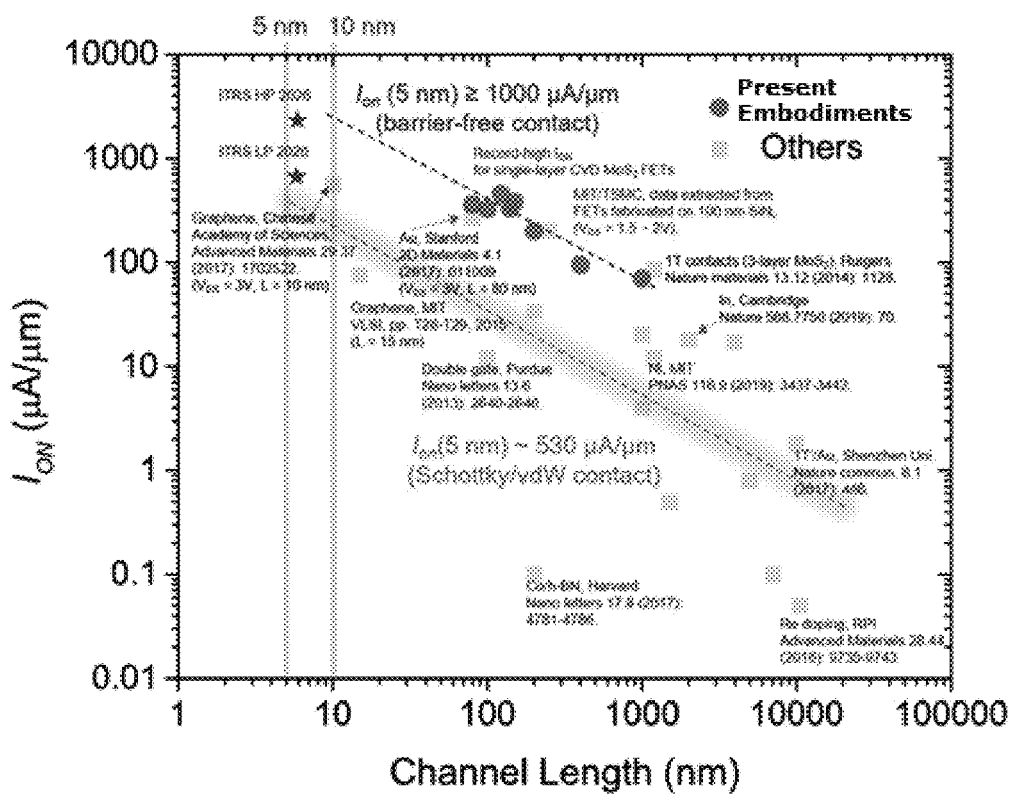
FIG. 5D is a graph comparing ON-current ($I_{ON}$) versus channel lengths of state-of-the-art MoS$_2$ transistors based on different contact methods.

FIGS. 5A-5D illustrate an embodiment of $I_{ON}$ for monolayer MoS$_2$ transistors of the present disclosure. More particularly, FIGS. 5A and 5B, and inset (II) in FIG. 5B, illustrate high-performance n-type field-effect transistors based on synthetic monolayer MoS$_2$ on 100-nm-thick SiNx (see inset (I)) with a high $I_{ON}/I_{OFF}$ ratio of approximately $>10^7$ and a record-high ON-current density ($I_{ON}$) of approximately $>450$ μA μm$^{-1}$ at a relatively low drain bias ($V_{DS}$=1.5 V) enabled by the presently disclosed ohmic contact methods using bismuth. The contact resistance is approximately 100 Ω μm, which is at least about one or two orders of magnitude lower than contact resistances achieved by other conventional metals, as highlighted by the largest shaded region in FIG. 5C. The present disclosure allows an ultra-low contact resistance meeting the current and future technology and approaching the quantum limit. FIG. 5D compares the ON-current ($I_{ON}$) versus channel lengths of state-of-the-art MoS$_2$ transistors based on different contact methods. The present disclosure enables a higher current delivery capability in monolayer MoS$_2$ field-effect transistors compared with other reported methods at a similar scale of channel length, and would meet the ITRS 2026 target when the channel length is further scaled down to approximately sub-10 nanometers.

While the present disclosure primarily discusses transistors with MoS$_2$, the use of bismuth in conjunction with contact areas can be extended to other semiconductors as well. For example, molybdenum diselenide (MoSe$_2$), tungsten disulfide (WS$_2$), tungsten diselenide (WSe$_2$), boron nitride, graphene, black phosphorus, indium telluride, germanium and germanane, silicon and silicene, tellurium nanosheets, gallium oxide (Ga$_2$O$_3$), and/or gallium nitride (GaN), among others. Similarly, the use of bismuth in conjunction with contact areas can be extended to many types of transistors, including, by way of non-limiting examples, beyond-Moore transistors (i.e., meaning transistors having new device architectures such as vertically stacked, gate-all-around, electro-mechanical switching structures, and/or new operation mechanisms such as spin, magnetic, phase-change, defect-migration, tunneling, piezoelectric, and ferroelectric effects), metal-oxide-semiconductor field-effect transistors (MOSFETs), tunnel field-effect transistors (TFETs), ferroelectric negative capacitance field-effect transistors (Fe-NCFETs), junction field-effect transistors (JFETs), fin field-effect transistors (FinFETs), gate-all-around field-effect transistors (GAAFETs), multiple-bridge-channel field-effect transistors (MBCFETs), vertically-stacked field-effect transistors, spin field-effect transistors (SpinFETs), and photovoltage field-effect transistors (PVFETs). Still further, the use of bismuth in conjunction with contact areas can be extended to many other semiconductor devices, and thus the present disclosure is by no means limited to transistors. Many other transistors or devices can include bismuth contact areas as provided for herein. Such transistors or devices include, but are not limited to, bipolar junction transistors, p-n junction diodes, electro-mechanical switches, impact ionization transistors, photovoltaic devices, spintronics, valleytronics, photonic devices, magnetic devices, and memristors.

Figure 6A:
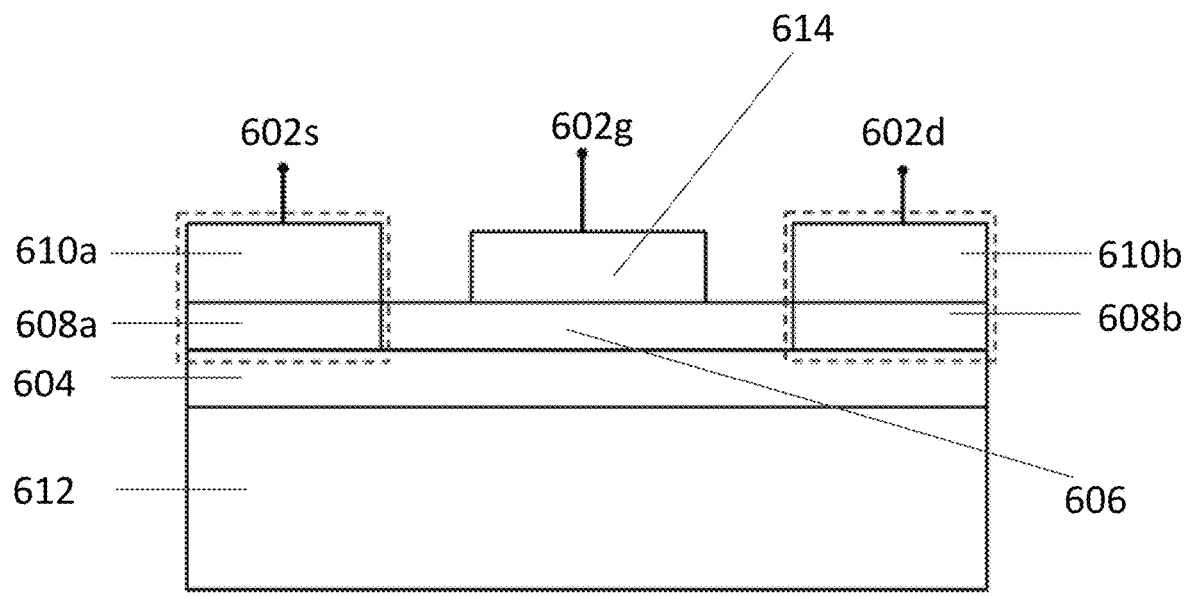
FIG. 6A is a schematic view of implementing the device of FIG. 1A into a metal-oxide-semiconductor field-effect transistor device.
Figure 6B:
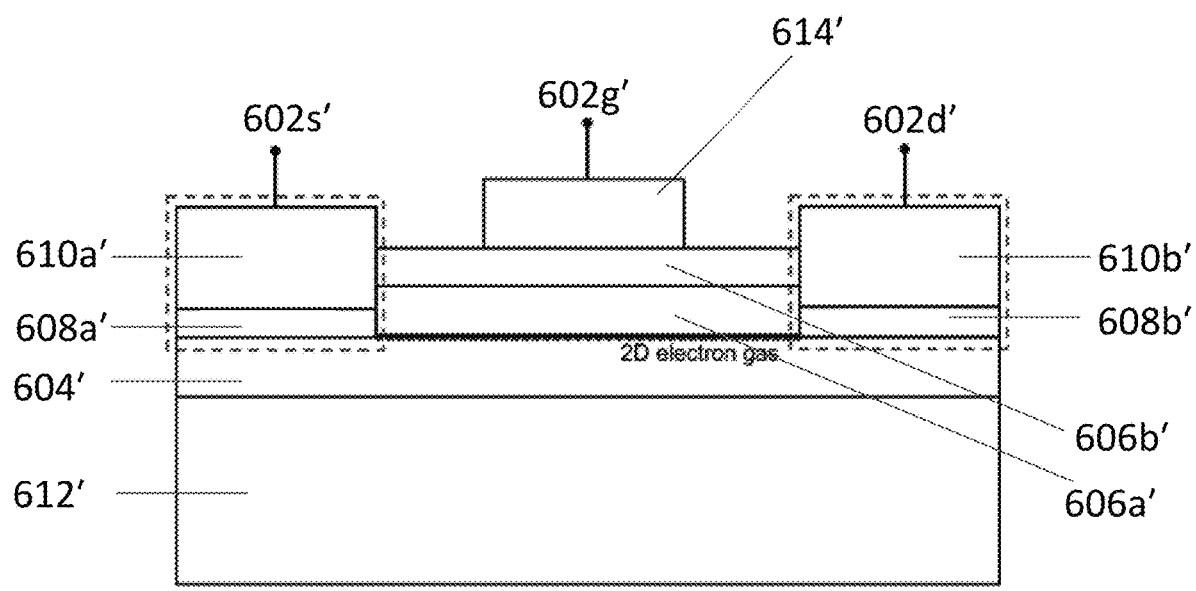
FIG. 6B is a schematic view of implementing the device of FIG. 1A into a gallium nitride device.

The whole stack of bismuth/2D material can be regarded as a new contact material. FIGS. 6A and 6B illustrate examples and methods regarding how to implement the present discourse into other existing semiconductor devices, such as MOSFETs and GaN devices. As shown in the device structures, one or more electrical contacts can be realized by a stack of bismuth deposited on 2D materials to reduce contact resistance.

An electrical contact area having a two-dimensional material disposed on a supporting substrate of a semiconductor device can be exposed for bismuth deposition to form ohmic contact. For example, FIG. 6A illustrates an implementation into a MOSFET device 600 in greater detail. As shown, the device 600 can include a gate end 602g, a source end 602s, and a drain end 602d on top of a dielectric 606. The source end 602s can include a two-dimensional material 608a, with one or more bismuth contacts 610a disposed thereon, while the drain end 602d can also include a two-dimensional material 608b, with one or more bismuth contacts 610b disposed thereon. It will be appreciated that the two-dimensional material 608a, 608b and/or the bismuth contacts 610a, 610b can be the same material or different materials. The dielectric 606 can be disposed next to (as shown, on top of) a semiconductor 604, which is disposed on a supporting substrate 612. As shown, the two-dimensional material 608a, 608b can be disposed side-by-side with the dielectric 606, with one or more metals 614 of the gate end 602g being disposed next to (as shown, on top of) the dielectric 606.

FIG. 6B illustrates an implementation into a GaN device 600'. As shown the device 600' can include a gate end 602g', a source end 602s', and a drain end 602d'. The source end 602s' can include a two-dimensional material 608a', with one or more bismuth contacts 610a' disposed thereon, while the drain end 602d' can also include a two-dimensional material 608b', with one or more bismuth contacts 610b' disposed thereon. It will be appreciated that the two-dimensional material 608a', 608b' and/or the bismuth contacts 610a', 610b' can be the same material or different materials.

As shown, a layer of aluminum gallium nitride (AlGaN) 606a' and a layer of silicon nitride (SiN) 606b' can be used in lieu of the dielectric 606 in FIG. 6A, with the layer of aluminum gallium nitride (AlGaN) 606a' being disposed next to (as shown, on top of) the layer of silicon nitride (SiN) 606b', though it will be appreciated that their order can be reversed. The layers 606a' and 606b' can be disposed next to (as shown, on top of) a GaN layer 604', which is disposed on a supporting substrate 612'. As shown, the two-dimensional material 608a', 608b' can be disposed side-by-side with the layers 606a', 606b', with one or more metals 614' of the gate end 602g' being disposed next to (as shown, on top of) the SiN layer 606b'. In some embodiments, a 2D electron gas layer can be disposed between the GaN layer 604' and the AlGaN layer 606a'.

Figure 7A:
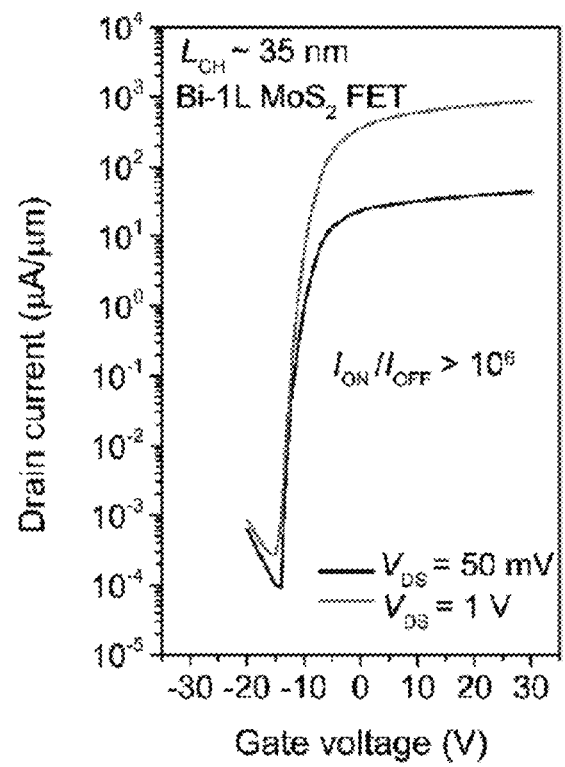
FIG. 7A is a graph showing another high-performance an n-type field-effect transistor based on synthetic monolayer MoS$_2$ with a high $I_{ON}/I_{OFF}$ ratio >10$^6$ and a record-high ON-current density ($I_{ON}$) of approximately greater than 1135 µAµm$^{-1}$ with a 35 nm channel device.
Figure 7B:
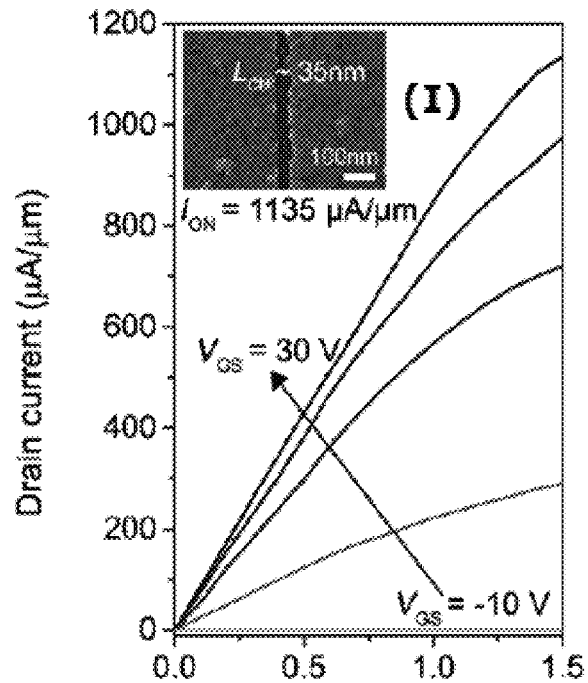
FIG. 7B is yet another graph showing high-performance an n-type field-effect transistor based on synthetic monolayer MoS$_2$ with a high $I_{ON}/I_{OFF}$ ratio of approximately >10$^6$ and a record-high ON-current density ($I_{ON}$) of approximately greater than 1135 µAµm$^{-1}$ with a 35 nm channel device.
Figure 7C:
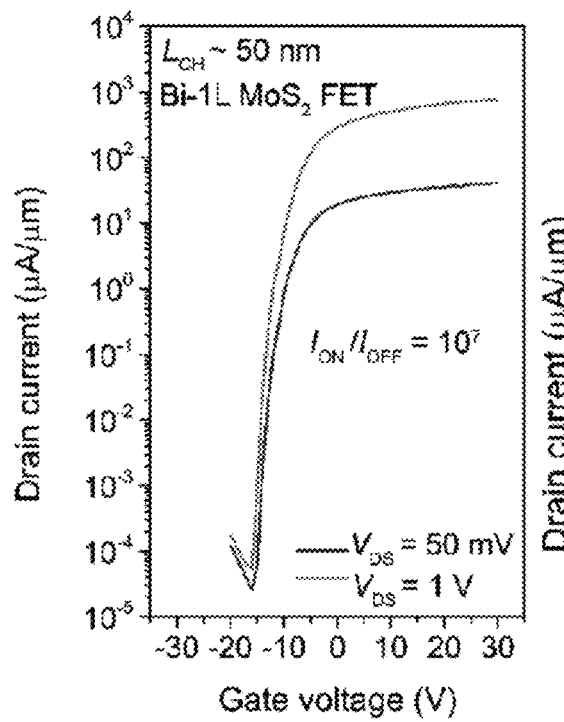
FIG. 7C is still another graph showing high-performance an n-type field-effect transistor based on synthetic monolayer MoS$_2$ with a high $I_{ON}/I_{OFF}$ ratio of approximately >10$^7$ and a record high ON-current density ($I_{ON}$) of approximately greater than 1005 µAµm$^{-1}$ with a 50 nm channel device.
Figure 7D:
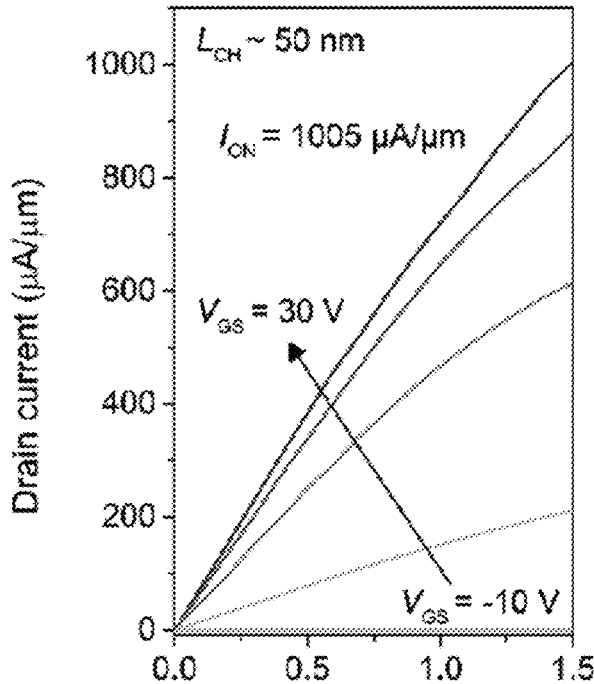
FIG. 7D is an additional graph showing high-performance an n-type field-effect transistor based on synthetic monolayer MoS$_2$ with a high $I_{ON}/I_{OFF}$ ratio of approximately >10$^7$ and a record high ON-current density ($I_{ON}$) of approximately greater than 1005 µAµm$^{-1}$ with a 50 nm channel device.

FIGS. 7A-7G illustrate an embodiment of record-high $I_{ON}$ for monolayer $MoS_2$ transistors of the present disclosure. More particularly, FIGS. 7A and 7B illustrate high-performance n-type field-effect transistors based on a synthetic monolayer $MoS_2$ with a high $I_{ON}/I_{OFF}$ ratio of approximately greater than $10^6$ and a record-high ON-current density ($I_{ON}$) of greater than approximately 1135 $\mu A\mu m^{-1}$ with a 35 nm channel device (see inset (I), while FIGS. 7C and 7D illustrate high-performance n-type field-effect transistors based on a synthetic monolayer $MoS_2$ with a high $I_{ON}/I_{OFF}$ ratio of approximately greater than $10^7$ and a record high ON-current density ($I_{ON}$) of greater than approximately 1005 $\mu A\mu m^{-1}$ with a 50 nm channel device, both at a relatively low drain bias ($V_{DS}$=1.5 V) enabled by the presently disclosed ohmic contact methods using bismuth. The contact resistance is approximately 100 $\Omega\mu m$.

A person skilled in the art will appreciate that the values provided for in conjunction FIGS. 7A-7G are merely examples, and that many other values can be used and achieved. Prior to the present disclosures, conventional $I_{ON}$ values for monolayer semiconductors at a drain voltage of 1.5 V were approximately less than about 500 $\mu A\mu m^{-1}$, with values greater than 500 $\mu A\mu m^{-1}$ being difficult to achieve using a monolayer semiconductor channel. This was due, at least in part, to high contact resistance. Thus, the values achieved in view of the present disclosures are noteworthy in how much better they perform than conventional designs prior to the present disclosure. The values of greater than approximately 1135 $\mu A\mu m^{-1}$ and greater than approximately 1005 $\mu A\mu m^{-1}$ presented in FIGS. 7A-7D are greater than a two-fold improvement over conventional values.

The present disclosures enables $I_{ON}$ values of at least approximately 450 $\mu A\mu m^{-1}$, at least approximately 500 $\mu A\mu m^{-1}$, at least approximately 600 $\mu A\mu m^{-1}$, up to at least approximately 2 $mA\mu m^{-1}$, and any value therebetween. Those values, of course, are dependent on other factors as provided for herein or otherwise known to those skilled in the art.

It will be appreciated that while values of approximately greater than 1135 $\mu A$ with a 35 nm channel device and approximately greater than 1005 $\mu A\mu m^{-1}$ with a 50 nm channel device discussed as examples in conjunction with FIGS. 7A-7D, the monolayer $MoS_2$ transistors of the present disclosure enable many $I_{ON}$ values that are improvements over conventional transistor designs, such values including but not limited to at least approximately 450 $\mu A\mu m^{-1}$ or greater, at least approximately 500 $\mu A\mu m^{-1}$ or greater, at least approximately 750 $\mu A\mu m^{-1}$ or greater, at least approximately 1005 $\mu A\mu m^{-1}$ or greater, at least approximately 1135 $\mu A\mu m^{-1}$ or greater, and at least approximately 2 $mA\mu m^{-1}$ (e.g., for a single layer less than about 1 nm semiconducting channel), among other values approximately in the range of about 450 $\mu A\mu m^{-1}$ to about 2 $mA\mu m^{-1}$. Likewise, the monolayer $MoS_2$ transistors of the present disclosure enable many $I_{ON}$ values ranges that are improvements over conventional transistor designs, including, by way of non-limiting examples, approximately in the range of about 450 $\mu A\mu m^{-1}$ to about 2 $mA\mu m^{-1}$, approximately in the range of about 450 $\mu A\mu m^{-1}$ to about 1135 $\mu A\mu m^{-1}$, approximately in the range of about 500 $\mu A\mu m^{-1}$ to about 1135 $\mu A\mu m^{-1}$, approximately in the range of about 500 $\mu A\mu m^{-1}$ to about 1005 $\mu A\mu m^{-1}$, or approximately in the range of about 500 $\mu A\mu m^{-1}$ to about 750 $\mu A\mu m^{-1}$. The example values, of course, are dependent on other factors as provided for herein or otherwise known to those skilled in the art. The present disclosures enables many values that are stark improvements over conventional transistor designs.

Figure 7E:
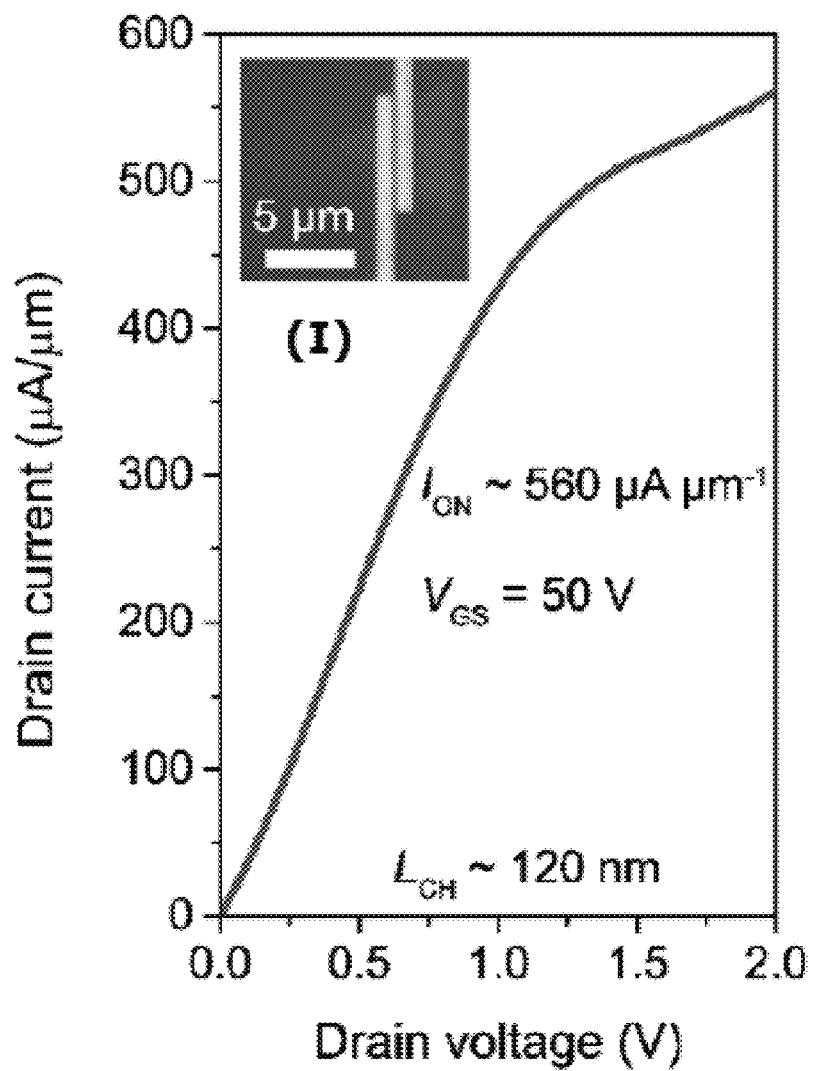
FIG. 7E is a graph showing output characteristics of a 120 nm channel device for monolayer MoS$_2$ that outperforms thicker transition metal dichalcogenides (TMDs) devices and its ON-current density ($I_{ON}$) is comparable to 3D semiconductor devices such as 90-nm node strained Si and AlGaAs/InGaAs HEMT transistors with similar channel lengths.
Figure 7F:
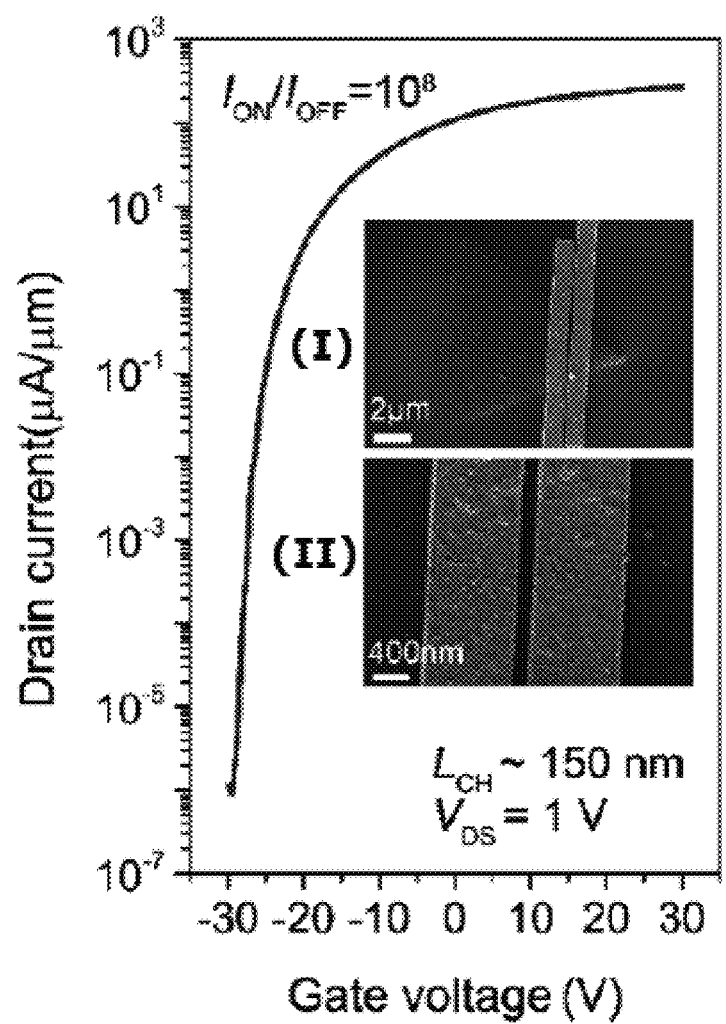
FIG. 7F is a semi-logarithmic plot of the transfer characteristics of a transistor showing an excellent $I_{ON}/I_{OFF}$ ratio of 10$^8$ and an SEM image of a representative 150-nm-channel length ($L_{CH}$) Bi-contacted monolayer MoS$_2$ FET on 100-nm-thick SiNx and its channel region.
Figure 7G:
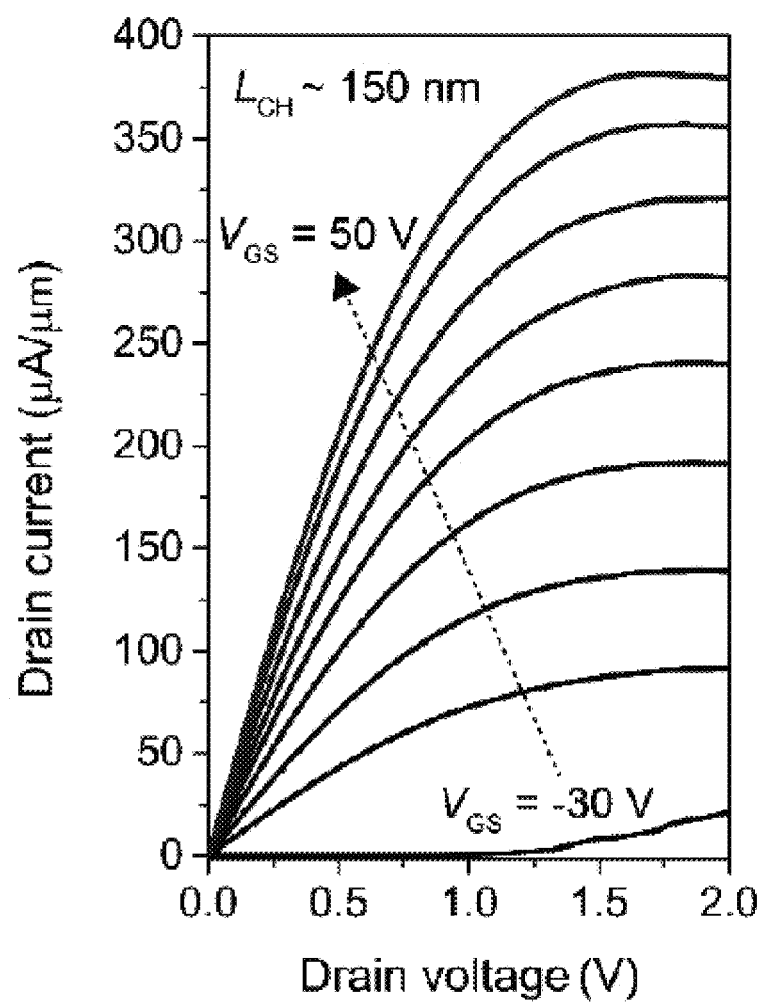
FIG. 7G is a semi-logarithmic plot of output characteristics of a transistor showing an excellent $I_{ON}/I_{OFF}$ ratio of 10$^8$ and an SEM image of a representative 150-nm-channel length ($L_{CH}$) Bi-contacted monolayer MoS$_2$ FET on 100-nm-thick SiNx and its channel region.

FIG. 7E and inset (I) illustrates output characteristics of a 120 nm channel device, which represents new records for monolayer $MoS_2$ that outperform thicker transition metal dichalcogenides (TMDs) devices and are comparable to 3D semiconductor devices such as 90-nm node strained Si and AlGaAs/InGaAs HEMT transistors with similar channel lengths. FIGS. 7F and 7G, and insets (I) and (II) in FIG. 7F, shows a semi-logarithmic plot of the transfer and output characteristics, respectively, of a transistor showing an excellent $I_{ON}/I_{OFF}$ ratio of about $10^8$ and an SEM image of a representative 150-nm-$L_{CH}$ Bi-contacted monolayer $MoS_2$ FET on 100-nm-thick SiNx and its channel region. The drain current saturates at VDS of approximately 1.5 V and scales approximately linearly with the gate voltage, which suggests that the electrons traveling in the monolayer $MoS_2$ channel reaches its saturation velocity. The gate dielectrics of devices presented in this figure are 100 nm SiNx.

FIGS. 8A-8E illustrate another exemplary embodiment of a configuration of the transistor 800 that uses bismuth. The transistor 800 can include a gate end 802g, a source end 802s, and a drain end 802d. Further, the transistor 800 can include a two-dimensional material 808 disposed between a gate 804 that can be disposed on top and on the bottom of the two-dimensional material 808. Still further, as shown, one or more bismuth contacts 810 can be disposed, for example, on either side of the two-dimensional material 808, thereby enveloping the two-dimensional material 808 on every side, as discussed in greater detail below.

Figure 8A:
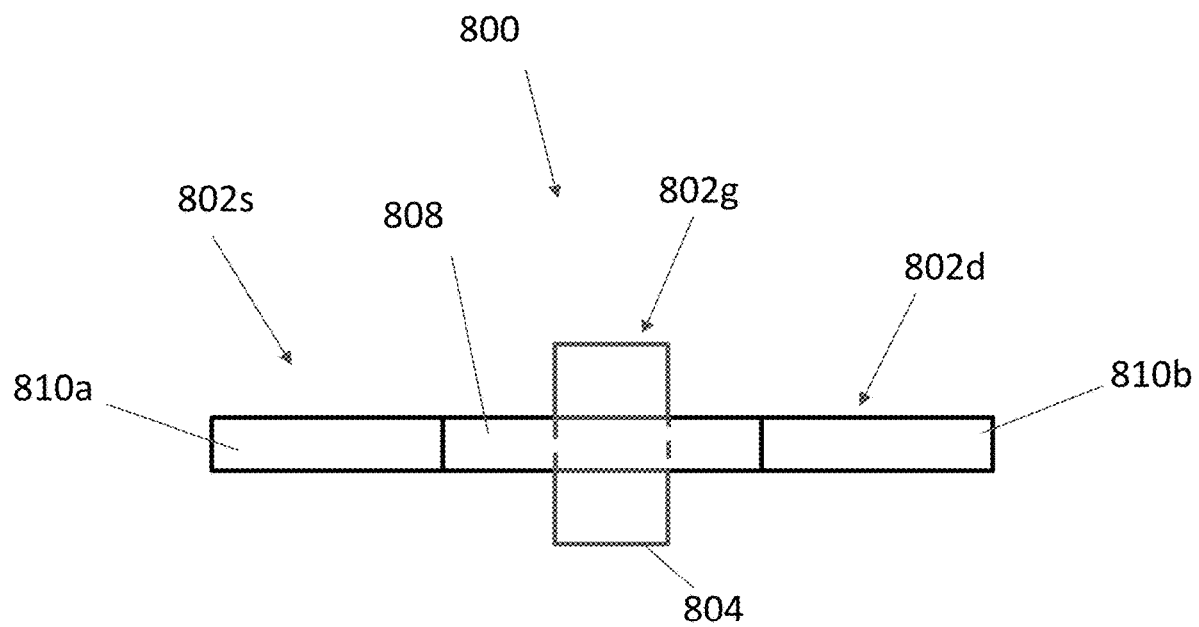
FIG. 8A is a schematic of a low-contact resistance, ohmic contact field-effect transistor showing the two-dimensional material surrounded by ohmic contacts and a plurality of gates.
Figure 8B:
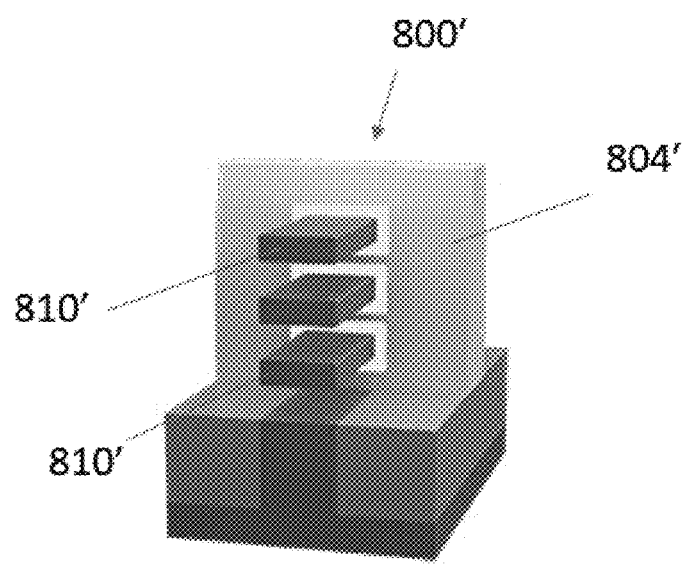
FIG. 8B is a schematic perspective view of another exemplary embodiment of a low-contact resistance, ohmic contact field-effect transistor having a gate all around the two-dimensional material.
Figure 8C:
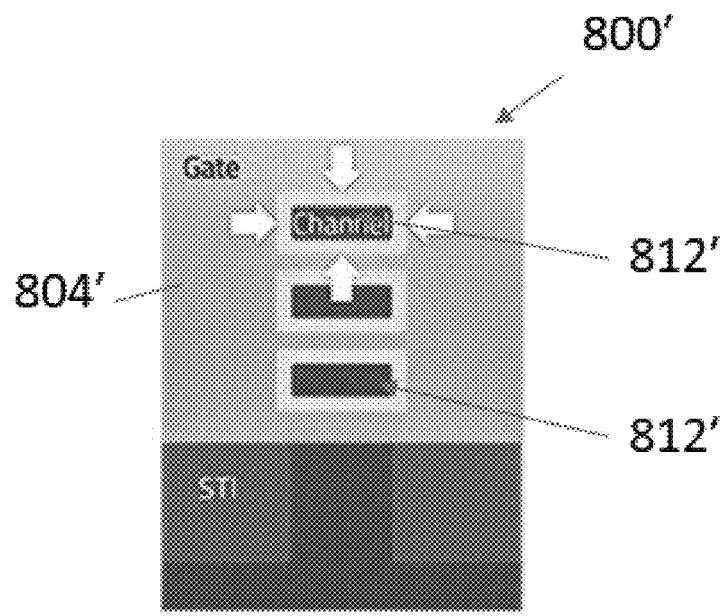
FIG. 8C is a schematic side view of the transistor of FIG. 8B having a plurality of channels formed therein.
Figure 8D:
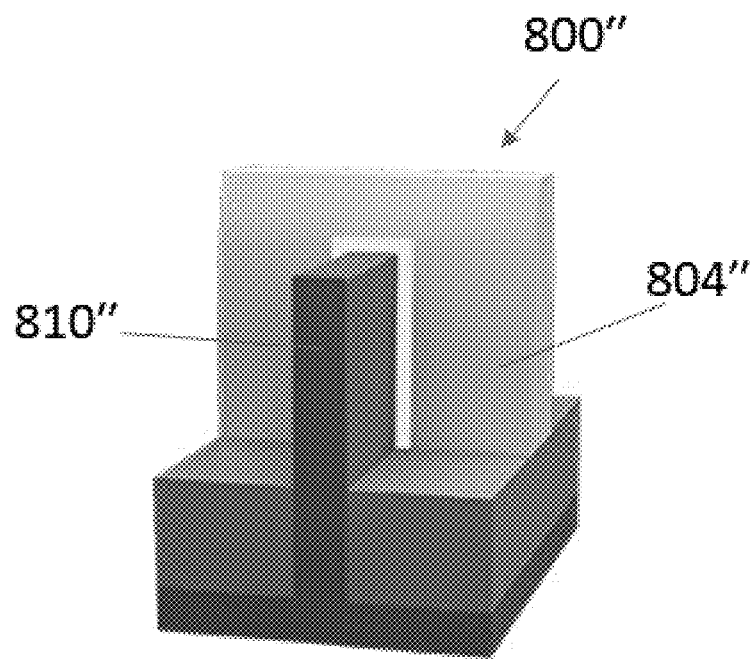
FIG. 8D is a schematic perspective view of another exemplary embodiment of a fin field effect transistor having a two-dimensional material disposed in a channel thereof.
Figure 8E:
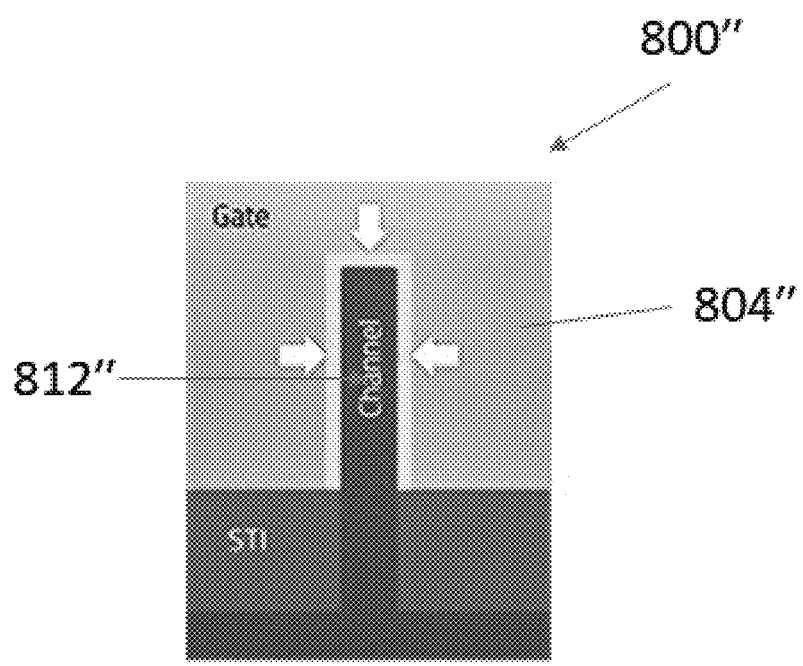
FIG. 8E is a schematic side view of the transistor of FIG. 8D having a channel formed therein.

FIGS. 8B-8C illustrate a gate-all-around transistor 800' architecture. As shown, in the gate-all-around-architecture, the gate 804' can surround a channel 812' that can be made up of a two-dimensional material 808'. The source end 802s and the drain end 802d can include one or more bismuth contacts 810' that can be received within the channel 812' such that the contacts 810' can be contacted with the 2D material channel in a side-by-side configuration, e.g., edge contact, as discussed with respect to FIG. 8A above, to inject current. As shown, the channels 812' in the all-around transistor 800' can be oriented substantially in parallel such that they are surrounded substantially completely by the gate 804'. FIGS. 8D-8E illustrate a FinFET transistor architecture 800" in which a channel 812" that receives the bismuth contacts 810" can be positioned in a vertical configuration surrounded by a gate 804". These orientations can, at least in some embodiments, enhance scalability due, at least in part, to more efficient gate control that results from the two-dimensional material being surrounded on every side by a component of the transistor.

Methods

The following disclosures represent non-limiting examples by which the disclosed embodiments can be fabricated.

Metal organic chemical vapor deposition (MOCVD) of monolayer $MoS_2$.

Monolayer $MoS_2$ films can be grown, by way of non-limiting example, using low-pressure metal-organic chemical vapor deposition (MOCVD). Molybdenum hexacarbonyl [e.g., $Mo(CO)_6$, 98%, Sigma Aldrich] and diethyl sulfide (e.g., $C_4H_{10}S$, 98%, Sigma Aldrich) can be selected as the precursors of molybdenum (Mo) and sulfur (S), respectively. With argon (Ar) as the carrier gas, the precursors can be supplied in the vapor form into the chamber using a homemade bubbler system. The monolayer $MoS_2$ films can be deposited on approximately 300 nm-thick $SiO_2$/Si wafers at approximately 320° C. for approximately 15 hours with the flow rates of approximately 100 sccm for Ar, approximately 0.6 sccm for $Mo(CO)_6$, and approximately 2.0 sccm for $C_4H_{10}S$.

Chemical Vapor Deposition (CVD) of Monolayer $MoS_2$.

Perylene-3,4,9,10-tetracarboxylic potassium salt (PTAS) molecules can be used as a seeding promoter and can be coated onto, for example, two clean $SiO_2$/Si pieces that can serve as seed reservoirs to provide the seeding molecules during the $MoS_2$ growth. The target substrate of an approximately 300 nm-thick $SiO_2$/Si wafer can be suspended between those two seed reservoirs. All of these three substrates can be faced down and placed on a crucible containing a molybdenum oxide (e.g., $MoO_3$, 99.98%) powder precursor. This $MoO_3$ precursor can be put in the middle of, by way of example, a quartz tube reaction chamber and another sulfur powder (e.g., 99.98%) precursor can be placed upstream in the quartz tube. Before heating, the CVD system can be purged, for example using approximately 1000 sccm of Ar (e.g. 99.999% purity) for approximately five (5) minutes. Next, the flow rate of Ar can be switched to approximately 20 sccm as the carrier gas for the $MoS_2$ growth, and the temperature of the reaction chamber can be increased to approximately 625° C. at a rate of approximately 30° C. min'. The monolayer $MoS_2$ can be synthesized at approximately 625° C. for approximately three (3) minutes under atmospheric pressure.

CVD of Monolayer $WS_2$.

This example provides for a simple method for deposition of monolayer $WS_2$ crystals at atmospheric pressure. Tungsten trioxide ($WO_3$) powder can be sprayed onto a piece of $SiO_2$/Si wafer, acting as a $WO_3$ reservoir during the deposition. The $SiO_2$/Si target substrate can be positioned face-up and downstream, approximately 1 cm away from the $WO_3$ reservoir. A crucible containing sulfur powder can be placed upstream. Prior to the growth, the reaction chamber can be purged using approximately 1000 sccm of Ar for approximately five (5) minutes. Then the furnace temperature can be ramped to approximately 800° C. at a rate of approximately 39° C./min and the deposition of monolayer $WS_2$ crystals can be implemented at approximately 800° C. for approximately five (5) minutes with approximately 50 sccm of Ar carrier gas.

CVD of Monolayer $WSe_2$.

In a further embodiment, a $(NH_4)_2WO_4$ aqueous solution (2 mg/mL) can be spin-coated (e.g., approximately 2500 rpm for approximately one (1) minute) onto an $SiO_2$/Si substrate, and then can be placed in a center of a furnace. Se powder (e.g., 30 mg, 99.5%, Sigma-Aldrich) can be loaded upstream about 17 cm away from the center. Before the growth, the tube can be flushed with approximately 300 sccm of Ar for approximately 10 minutes, which can eliminate residual oxygen and moisture. During the growth, the temperature can be increased to approximately 900° C. at a rate of approximately 50° C./min and the growth can last for approximately 10 minutes with approximately 30 sccm of Ar and approximately 10 sccm of $H_2$ flow as the carrier gases. After the growth, the furnace can be rapidly cooled to room temperature.

Mechanical Exfoliation of Monolayer $WS_2$ and $WSe_2$.

By way of a further example, monolayer $WS_2$ and $WSe_2$ flakes can be mechanically exfoliated onto approximately 100-nm-thick SiNx dielectrics by a standard scotch tape technique known to those skilled in the art. Prior to device fabrication, the exfoliated TMD flakes can be immersed in acetone for approximately three (3) hours to remove the tape residues. Raman spectroscopy can be performed on the selected TMD flakes to confirm their monolayer characteristics for further device.

Transfer of Monolayer Transition Metal Dichalcogenides (TMDs) on Dielectric/Si Substrates.

In still a further embodiment, the monolayer TMD crystals grown by MOCVD or CVD can be transferred onto the dielectric/p++-Si substrates for device fabrication using a wet transfer process. First, poly(methyl methacrylate) (PMMA) can be spin-coated onto the monolayer TMD samples. Then, the PMMA/TMD stacks can be released from the $SiO_2$/Si growth substrate, for instance by etching in a concentrated potassium hydroxide (KOH) aqueous solution at approximately 90° C. The freestanding PMMA/TMD stacks can be picked up, rinsed with deionized water, for instance three (3) times for approximately two (2) hours, and then can be attached onto the target substrates. To dry the samples and enhance the adhesion, the PMMA/TMD stacks can be baked on the hotplate at approximately 70° C. for approximately 20 minutes and approximately 130° C. for another approximately 20 minutes. Finally, the sample can be immersed in cold acetone for at least approximately six (6) hours to remove the PMMA.

Device Fabrication and Characterization.

In accordance with the present disclosures, monolayer TMD crystals can be confirmed by Raman and PL characterization and then selected for transistor fabrication. Electron-beam (e-beam) lithography can be used to define the channel and the source/drain contacts with PMMA e-beam resists (MicroChem). Metallization can be implemented by e-beam evaporation of, for example, 20-nm bismuth with a well-controlled deposition rate of approximately 0.5 angstrom (Å)/second (s), followed by, for example, an Au capping layer (e.g., approximately in the range of about 10 nm to about 100 nm, at approximately 2 Å/s) at approximately 10-6 torr. A liftoff process can be carried out, for example, in hot acetone. In conjunction with the present disclosures, no annealing or chemical doping treatment can be performed on the devices if desired. The channel widths for the devices in at least some of these examples can be approximately in the range of about 2 μm to about 10 μm. If desired, all electrical characterizations can be conducted in a vacuum environment (e.g., approximately in the range of about 10-5 torr to about 10-6 torr) in, for example, a Lakeshore probe station using a Keysight B1500A semiconductor parameter analyzer. In at least some instances, the electrical resistivity of the evaporated bismuth film can be measured to be approximately 9×10-6 Ω·m. The gate dielectrics for the monolayer TMD transistors provided for in conjunction with the present disclosures include approximately 300-nm-thick $SiO_2$ (NOVA Electronic Materials) and approximately 100-nm-thick $SiN_x$ (MTI Corporation). To estimate the sheet carrier density and carrier mobility of the devices accurately, the capacitances for the dielectrics can be measured, for example, at approximately 1 MHz with Keysight B1505A power device analyzer on separate metal-insulator-metal capacitors at room temperature.

Sample Preparation for Raman and XPS Characterizations.

In one non-limiting example of preparing a sample for Raman and XPS characterization, an approximately 20-nm of bismuth thin film can be deposited on a continuous monolayer $MoS_2$ film grown on an $SiO_2$/Si wafer. An Au capping layer can also be provided, which can be used for e-beam evaporation. A resulting heterostructure of Au—Bi—$MoS_2$ can be peeled off, for example by a thermal tape, due to the relatively weak interaction between the $MoS_2$ film and the silica substrate. The sample can be inverted to expose the continuous $MoS_2$ film on top of the bismuth film for characterization. In this way, a pristine Bi—$MoS_2$ interface can be used without oxidation of bismuth. This method allows us the Raman and XPS characterizations on the Bi—$MoS_2$ interface to be carried out directly.

Raman Spectroscopy.

In a non-limiting instance of using Rama spectroscopy, Raman spectroscopy of monolayer $MoS_2$ flakes can be carried out on a confocal Raman system of HR800 (Horiba Scientific) with a laser wavelength of approximately 523 nm at a laser power of approximately 2.5 mW and accumulation time of approximately 0.5 seconds. The emitted Stokes Raman signal can be collected, for example, by a 0.9 N.A. of 100× objective of Carl Zeiss Microscopy GmbH with an approximately 1800 lines/mm grating for the measurements. The spectrum can be calibrated by the silicon characteristic peak at approximately 520.6 $cm^{-1}$ from an undoped silicon wafer.

X-Ray Photoelectron Spectroscopy (XPS) Analysis.

In a non-limiting instance of using XPS analysis, the XPS measurement can be carried out by using a PHI Versaprobe II XPS instrument with monochromated Al kα source (e.g., 1486.6 eV) and a spot size of approximately 200 μm. An approximately 50 W gun power and approximately 15 kV operation voltage can be used during spectrum acquisition. During the measurement, samples can be flooded with electron and Ar ion guns to compensate the surface charging. All the XPS spectra presented in conjunction with the present disclosures can be calibrated by the C1s peak at approximately 284.8 eV. The XPS spectra can be analyzed and fitted by a Gaussian/Lorentzian mix function.

The illustrated and described systems, devices, methods, configurations, shapes, and sizes are in no way limiting. A person skilled in the art, in view of the present disclosures, will understand how to apply the teachings of one embodiment to other embodiments either explicitly or implicitly provided for in the present disclosures. Further, a person skilled in the art will appreciate further features and advantages of the present disclosure based on the above-described embodiments. Accordingly, the disclosure is not to be limited by what has been particularly shown and described, except as indicated by the appended claims. All publications and references cited herein, including the aforementioned document and provisional application, are expressly incorporated herein by reference in their entirety.

Some non-limiting claims that are supported by the contents of the present disclosure are provided below.

What is claimed is:

1. A semiconductor device, comprising:
a two-dimensional material;
one or more electrical contacts, the at least one electrical contact of the one or more electrical contacts is disposed on the two-dimensional material;
a dielectric layer directly coupled to the two-dimensional material; and
a gate directly coupled to the dielectric layer, the two-dimensional material being located between the gate and the electrical contacts,
wherein at least one electrical contact of the one or more electrical contacts comprises one or more of: bismuth, antimony, or arsenic,
wherein the at least one electrical contact of the one or more electrical contacts comprises bismuth, is configured to induce gap-state saturation, and is disposed on the two-dimensional material forming an ohmic contact, and
wherein the two-dimensional material includes one or more of molybdenum disulfide, molybdenum diselenide, tungsten disulfide, tungsten diselenide, or heterostructures thereof, indium telluride, silicene, germanene, diamondene, gallium oxide, or combinations thereof.

2. The semiconductor device of claim 1, wherein the one or more electrical contacts comprise a bismuth/2D material stack.

3. The semiconductor device of claim 1, wherein the semiconductor device comprises a transistor.

4. The semiconductor device of claim 3, wherein an ON-current of the transistor is approximately in the range of about 450 $\mu A \mu m^{-1}$ to about 2 $mA \mu m^{-1}$.

5. The semiconductor device of claim 3, wherein an ON-current of the transistor is approximately in the range of about 500 $\mu A \mu m^{-1}$ to about 1135 $\mu A \mu m^{-1}$.

6. The semiconductor device of claim 3, with the semiconductor device further comprising the two-dimensional material and the at least one electrical contact of the one or more electrical contacts being disposed on the two-dimensional material, wherein the transistor comprises:
a gate end;
a source end; and
a drain end, wherein the source end and the drain end are located on the two-dimensional material and the gate end is located between the source end and the drain end.

7. The semiconductor device of claim 3, wherein the transistor comprises a field-effect transistor.

8. The semiconductor device of claim 7, wherein the field-effect transistor comprises at least one of a beyond Moore transistor, a metal-oxide-semiconductor field-effect transistor, a tunnel field-effect transistor, a ferroelectric negative capacitance field-effect transistor, a junction field-effect transistor, a fin field-effect transistor, a gate-all-around field effect transistor, a multi-bridge-channel field-effect transistor, a vertically-stacked field effect transistor, a spin field-effect transistor, or a photovoltage field-effect transistor.

* * * * *